United States Patent
Kim et al.

(10) Patent No.: US 10,756,023 B2
(45) Date of Patent: Aug. 25, 2020

(54) SEMICONDUCTOR PACKAGE

(71) Applicant: SAMSUNG ELECTRONICS CO., LTD., Suwon-si (KR)

(72) Inventors: Han Kim, Suwon-si (KR); Hyung Joon Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 360 days.

(21) Appl. No.: 15/905,046

(22) Filed: Feb. 26, 2018

(65) Prior Publication Data

US 2019/0122993 A1 Apr. 25, 2019

(30) Foreign Application Priority Data

Oct. 19, 2017 (KR) .................... 10-2017-0136006

(51) Int. Cl.
*H01L 23/552* (2006.01)
*H01L 23/13* (2006.01)
(Continued)

(52) U.S. Cl.
CPC ............ *H01L 23/552* (2013.01); *H01L 23/13* (2013.01); *H01L 23/3107* (2013.01);
(Continued)

(58) Field of Classification Search
CPC . H01L 23/13; H01L 23/5384; H01L 23/5389; H01L 23/552; H01L 25/16; H01L 2224/24195; H01L 2924/19105
See application file for complete search history.

(56) References Cited

U.S. PATENT DOCUMENTS 7,626,216 B2  12/2009  McKinzie, III
8,241,964 B2   8/2012  Pagaila et al.
(Continued)

FOREIGN PATENT DOCUMENTS

JP  2011-165824 A  8/2011
JP  2011-187919 A  9/2011
(Continued)

OTHER PUBLICATIONS

Communication dated May 14, 2019, from the Japanese Patent Office in counterpart application No. 2018-044652.
(Continued)

*Primary Examiner* — Marcos D. Pizarro
(74) *Attorney, Agent, or Firm* — Sughrue Mion, PLLC

(57) ABSTRACT

A semiconductor package includes a connection member and a supporting member. The connection member has first and second surfaces opposing each other and a redistribution layer. The supporting member is disposed on the first surface of the connection member, has a first through-hole and a second through-hole spaced apart from each other, and has a blocking layer disposed on at least an inner surface of the second through-hole. A semiconductor chip is disposed in the first through-hole and has connection pads connected to the redistribution layer. At least one passive component is disposed in the second through-hole and has connection terminals connected to the redistribution layer. An encapsulant encapsulates the semiconductor chip and the at least one passive component in the first and second through-holes, respectively. An electromagnetic band-gap (EBG) structure is embedded in the supporting member.

27 Claims, 18 Drawing Sheets

(51) Int. Cl.
*H01L 23/00* (2006.01)
*H01L 23/31* (2006.01)
*H01L 25/16* (2006.01)
*H01L 23/58* (2006.01)
*H01L 23/538* (2006.01)
*H01L 23/367* (2006.01)

(52) U.S. Cl.
CPC ...... *H01L 23/3677* (2013.01); *H01L 23/5384* (2013.01); *H01L 23/5386* (2013.01); *H01L 23/5389* (2013.01); *H01L 23/585* (2013.01); *H01L 24/05* (2013.01); *H01L 24/24* (2013.01); *H01L 25/16* (2013.01); *H01L 23/3114* (2013.01); *H01L 23/3128* (2013.01); *H01L 2224/02379* (2013.01); *H01L 2224/24195* (2013.01); *H01L 2924/19041* (2013.01); *H01L 2924/19042* (2013.01); *H01L 2924/19105* (2013.01); *H01L 2924/3025* (2013.01)

(56) References Cited

U.S. PATENT DOCUMENTS

| | | | |
|---|---|---|---|
| 8,699,234 B2 | 4/2014 | Kim et al. | |
| 2011/0216513 A1* | 9/2011 | Lee | H05K 1/185 361/761 |
| 2012/0275117 A1 | 11/2012 | Choudhruy et al. | |
| 2012/0325537 A1 | 12/2012 | Toyao et al. | |
| 2014/0021591 A1 | 1/2014 | Sung et al. | |
| 2014/0029227 A1 | 1/2014 | Sasaki et al. | |
| 2015/0021081 A1* | 1/2015 | Mitarai | H05K 1/115 174/260 |
| 2015/0043172 A1 | 2/2015 | Mugiya et al. | |
| 2016/0336249 A1 | 11/2016 | Kang et al. | |
| 2016/0338202 A1 | 11/2016 | Park | |
| 2017/0103951 A1 | 4/2017 | Lee et al. | |
| 2017/0179039 A1 | 6/2017 | Lee et al. | |
| 2018/0092257 A1* | 3/2018 | Otsubo | H01L 23/552 |

FOREIGN PATENT DOCUMENTS

| | | |
|---|---|---|
| JP | 2011-258910 A | 12/2011 |
| JP | 2012-060056 A | 3/2012 |
| JP | 2014-229866 A | 12/2014 |
| JP | 2015-38962 A | 2/2015 |
| JP | 2015-57815 A | 3/2015 |
| JP | 2015-97273 A | 5/2015 |
| KR | 10-2016-0132749 A | 11/2016 |
| KR | 10-2016-0132763 A | 11/2016 |
| WO | 2011111314 A1 | 9/2011 |
| WO | 2016181954 A1 | 11/2016 |
| WO | 2017/167987 A1 | 10/2017 |

OTHER PUBLICATIONS

Communication dated Jun. 1, 2019, issued by the Korean Intellectual Property Office in corresponding Korean Application No. 10-2017-0136006.

Office Action issued in Korean Patent Application No. 10-2017-0136006 dated Jan. 15, 2019, with English translation.

Office Action issued in Taiwanese Patent Application No. 107105865 dated Mar. 26, 2019, with English translation.

\* cited by examiner

SEMICONDUCTOR PACKAGE

CROSS-REFERENCE TO RELATED APPLICATION(S)

This application claims benefit of priority to Korean Patent Application No. 10-2017-0136006, filed on Oct. 19, 2017 in the Korean Intellectual Property Office, the disclosure of which is incorporated herein by reference in its entirety.

BACKGROUND

1. Field

The present disclosure relates to a semiconductor package in which at least one semiconductor chip and a plurality of passive components are mounted.

2. Description of Related Art

Increases in the sizes of mobile apparatus displays have fueled demand for increased battery capacity. However, as battery capacity is increased, the area occupied by batteries in mobile apparatuses has increased. To maintain small mobile device size, a corresponding reduction in size of printed circuit boards (PCBs) may therefore be desirable. Therefore, areas in which components are able to be mounted have been reduced, such that interest in modularization has continuously increased.

Meanwhile, in the related art, a plurality of components may be mounted using chip on board (COB) technology. COB mounting is a mounting scheme in which individual passive elements and a semiconductor package are provided on a printed circuit board using surface-mount technology (SMT). However, in such a mounting scheme, a wide mounting area is desirable in order to maintain a minimum interval between components, electromagnetic interference (EMI) between components is high, and in particular, a distance between the semiconductor chip and the passive components is great, such that electric noise may be increased.

SUMMARY

An aspect of the present disclosure may provide a semiconductor package in which an electromagnetic interference (EMI) vulnerable portion, to which it may be difficult to apply EMI blocking when a semiconductor chip and a plurality of passive components are modularized, is improved.

According to an aspect of the present disclosure, a semiconductor package having a plurality of passive components and a semiconductor chip mounted using a supporting member having a plurality of through-holes may be provided, in which an electromagnetic band-gap (EBG) structure that is an electromagnetic interference (EMI) absorbing structure is introduced into a region of the supporting member in order to complement an existing EMI blocking structure.

According to an aspect of the present disclosure, a semiconductor package may include a connection member and a supporting member. The connection member has first and second surfaces opposing each other and includes a redistribution layer. The supporting member is disposed on the first surface of the connection member, has a first through-hole and a second through-hole spaced apart from each other, and has a blocking layer disposed on at least an inner surface of the second through-hole. A semiconductor chip can be disposed in the first through-hole and have connection pads connected to the redistribution layer. At least one passive component can be disposed in the second through-hole and have connection terminals connected to the redistribution layer. An encapsulant can encapsulate the semiconductor chip and the at least one passive component in the first and second through-holes, respectively. An electromagnetic band-gap (EBG) structure is embedded in the supporting member.

According to another aspect of the present disclosure, a semiconductor package may include a connection member and a supporting member. The connection member has first and second surfaces opposing each other and includes a redistribution layer. The supporting member is disposed on the first surface of the connection member and has a first through-hole and a plurality of second through-holes. Electromagnetic wave blocking layers are disposed on inner surfaces of the plurality of second through-holes and are not disposed on an inner surface of the first through-hole. A semiconductor chip can be disposed in the first through-hole and have connection pads connected to the redistribution layer. A plurality of passive components can be disposed in the plurality of second through-holes, and have connection terminals connected to the redistribution layer. The supporting member can include an outer sidewall structure defining a contour of the supporting member, a first inner sidewall structure surrounding the first through-hole, and a second inner sidewall structure connected between the first inner sidewall structure and the outer sidewall structure. An electromagnetic band-gap structure is further disposed in a region of the outer sidewall structure connected to the second inner sidewall structure.

According to another aspect of the present disclosure, a semiconductor package includes a connection member and a supporting member. The connection member has first and second surfaces opposing each other and includes a redistribution layer. The supporting member is disposed on the first surface of the connection member to have a first surface thereof on the first surface of the connection member and to have a second surface opposing the first surface, the supporting member has a plurality of through-holes extending from the first surface to the second surface thereof, the plurality of through-holes includes a first through-hole spaced apart from side surfaces of the supporting member and at least one second through-hole disposed between the first through-hole and each side surface of the supporting member. A conductive metal layer is disposed on inner surfaces of the at least one second through-hole disposed between the first through-hole and each side surface of the supporting member.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments will be described with reference to the accompanying drawings. In the accompanying drawings, shapes, sizes, and the like, of components may be exaggerated or shortened for clarity.

Herein, a lower side, a lower portion, a lower surface, and the like, are used to refer to a side/portion/surface facing toward a mounted surface of the fan-out semiconductor package in relation to cross sections of the drawings, while an upper side, an upper portion, an upper surface, and the like, are used to refer to a side/portion/surface facing in an opposite direction (e.g., facing away from the mounted surface). However, these directions are defined for convenience of explanation, and the claims are not particularly limited by the directions defined as described above.

The meaning of a "connection" of a component to another component in the description includes an indirect connection through an adhesive layer as well as a direct connection (e.g., direct contact) between two components. In addition, "electrically connected" components/elements include components/elements that are physical connected to each other to provide electrical connection and components/elements that are physical disconnected from each other but nonetheless electrically connected through intermediate components/elements. It can be understood that when an element is referred to with "first" and "second", the element is not limited thereby. The "first" and "second" terminology may be used only for a purpose of distinguishing the element from the other elements and may not limit the sequence or importance of the elements. In some cases, a first element may be referred to as a second element without departing from the scope of the disclosure or claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than to limit the present disclosure. In this case, singular forms include plural forms unless interpreted otherwise in context.

Electronic Device

Figure 1:
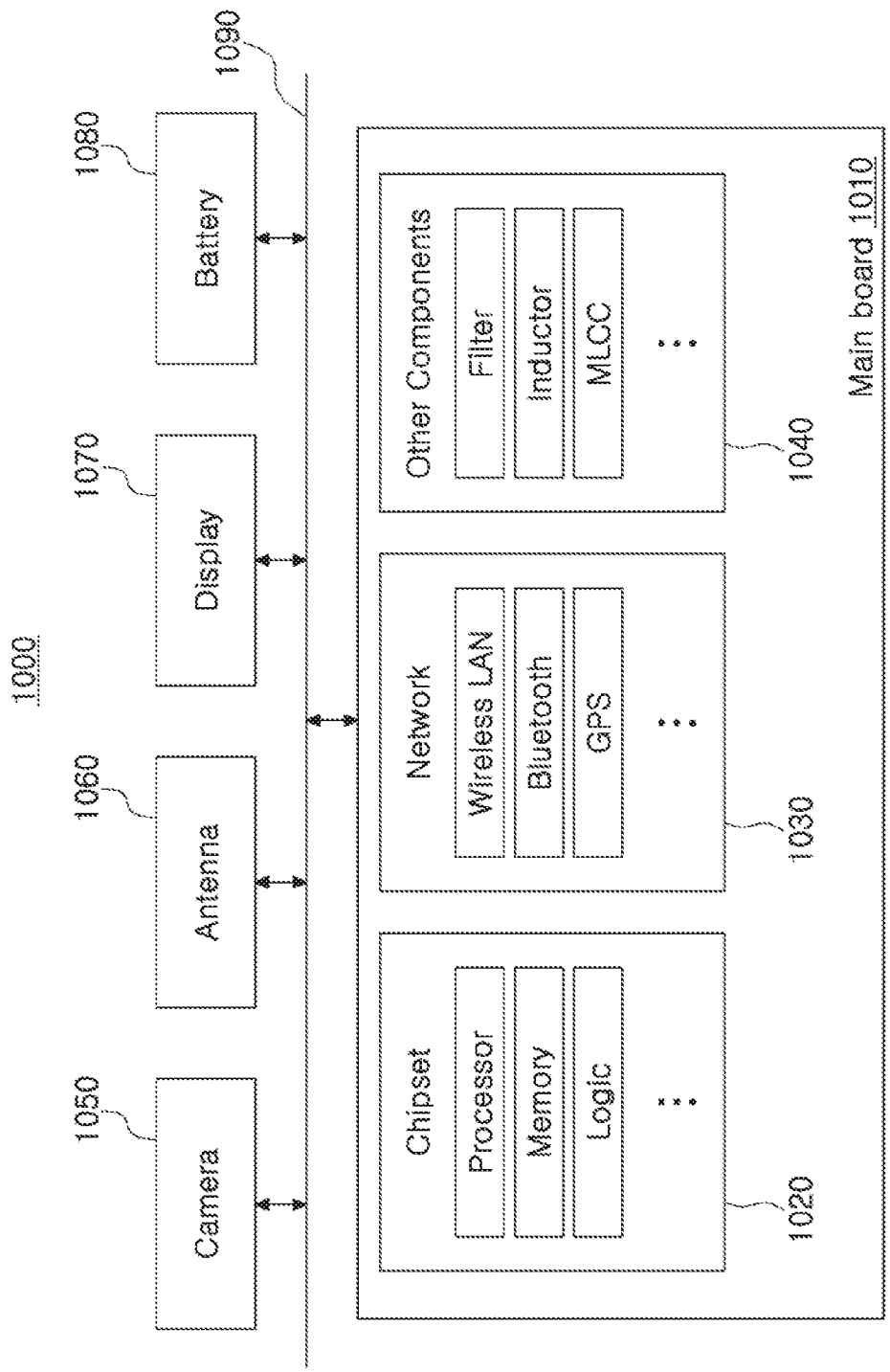
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to other components, to be described below, to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include components implementing protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
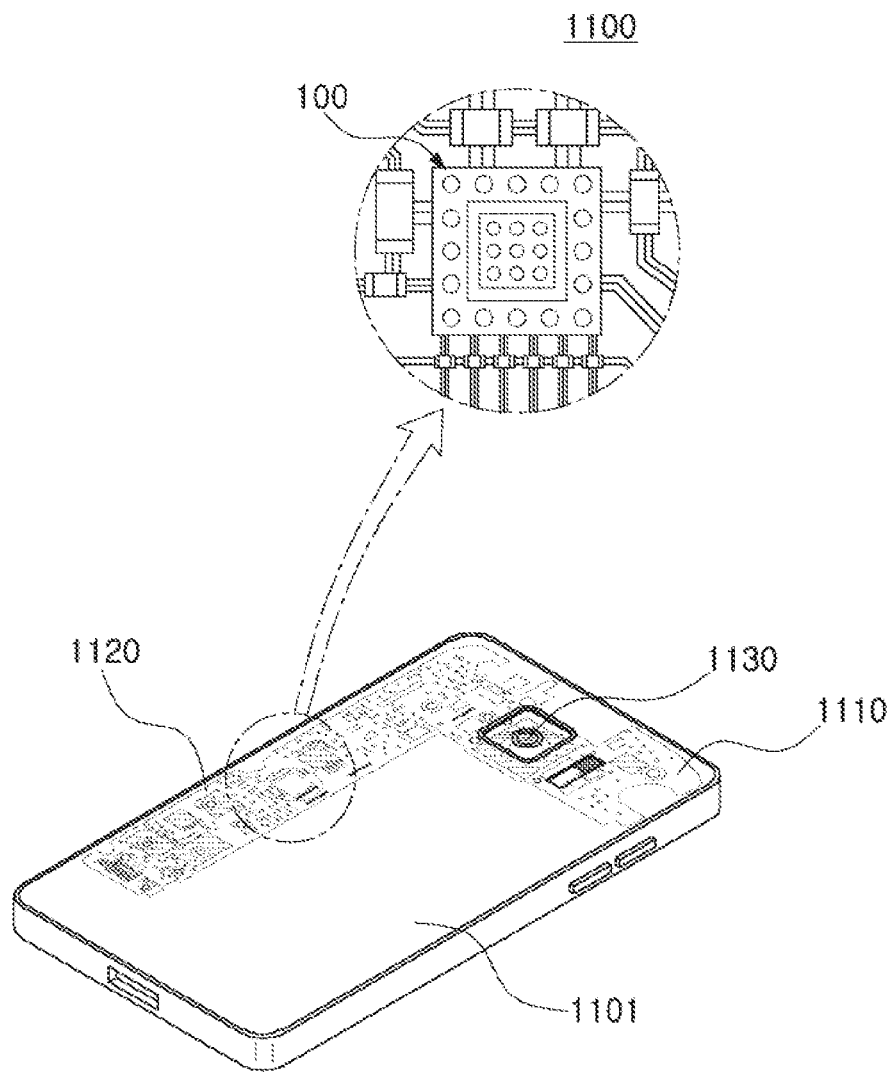
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the main board 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in itself, and may be damaged due to external physical or chemical impact. Therefore, the semiconductor chip may not be used by itself, but is instead packaged and used in an electronic device or the like in a package state.

The reason why semiconductor packaging is commonly used is that there is generally a difference in a circuit width between the semiconductor chip and a main board of the electronic device in terms of electrical connection. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and use of packaging technology for buffering a difference in a circuit width between the semiconductor and the main board is thus advantageous.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figures 3A, 3B:
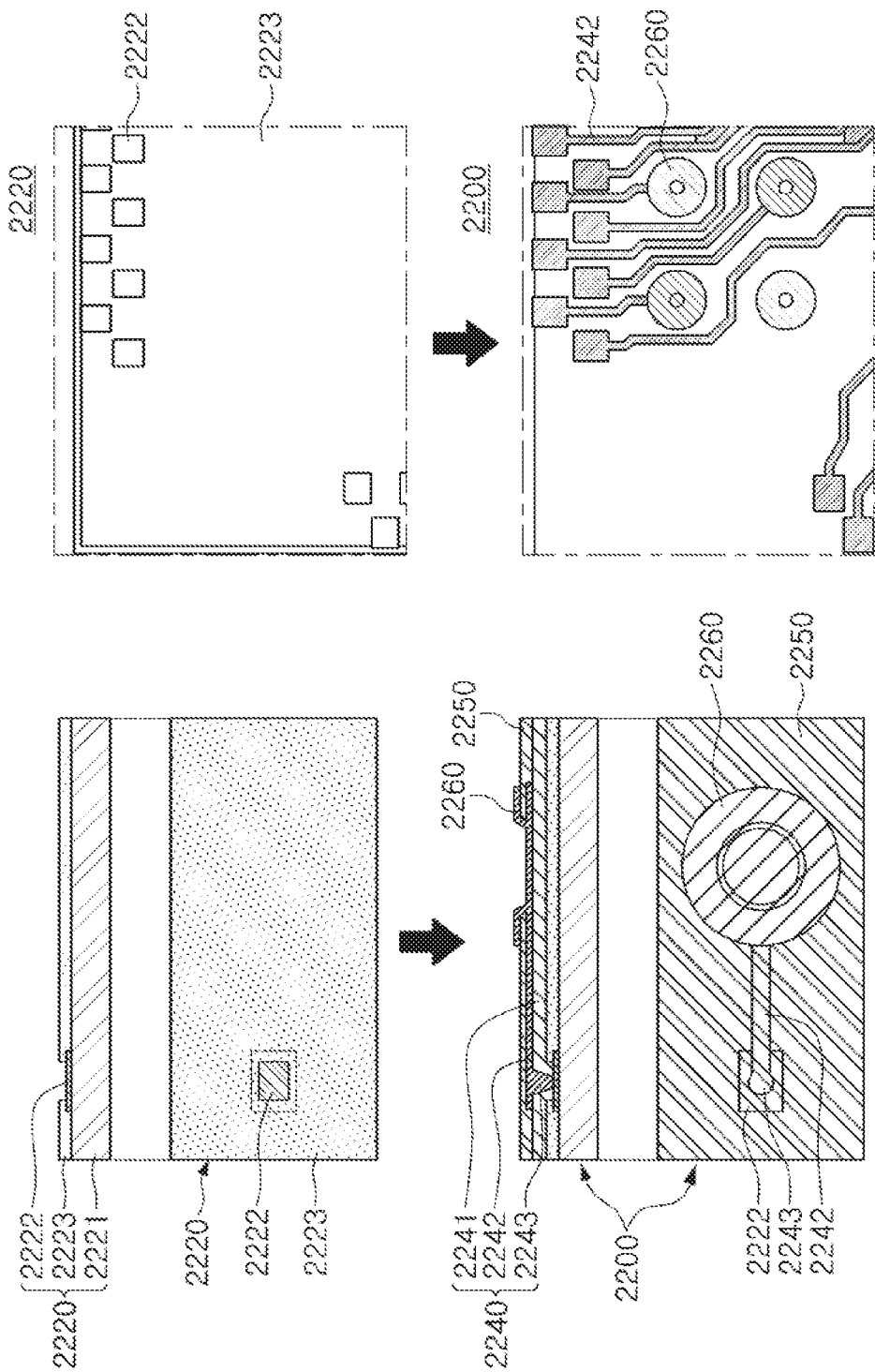
FIGS. 3A and 3B are schematic cross-sectional views illustrating a fan-in semiconductor package before and after being packaged.
Figure 4:
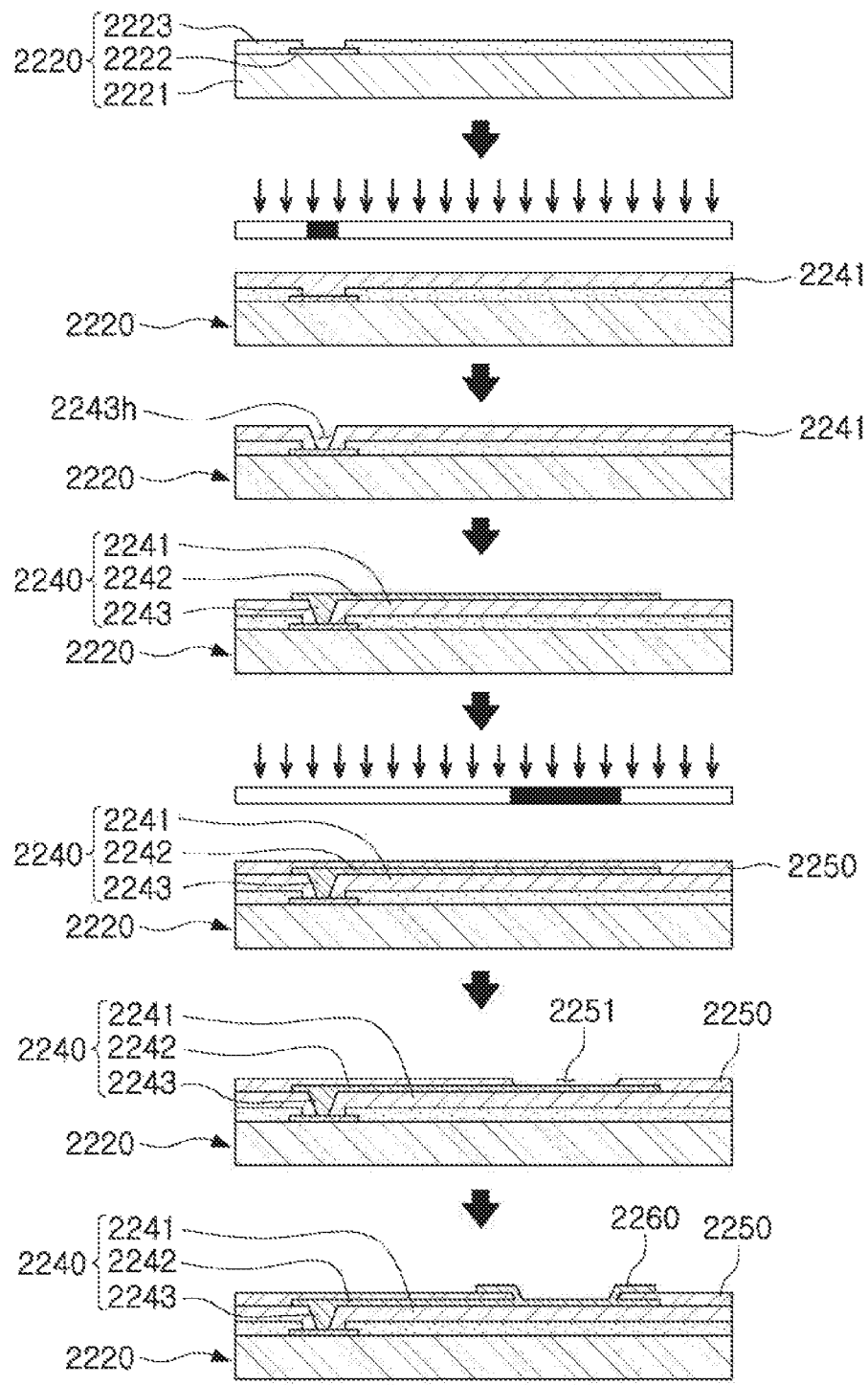
FIG. 4 is schematic cross-sectional views illustrating a packaging process of a fan-in semiconductor package.

FIGS. 3A and 3B are schematic cross-sectional views illustrating a fan-in semiconductor package before and after being packaged, and FIG. 4 shows a series of schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the main board of the electronic device, or the like.

Therefore, depending on a size of the semiconductor chip 2220, a connection member 2240 may be formed on the semiconductor chip 2220 in order to redistribute the connection pads 2222. The connection member 2240 may be formed by forming an insulating layer 2241 on the semiconductor chip 2220 using an insulating material such as a photoimageable dielectric (PID) resin, forming via holes 2243h opening on to the connection pads 2222, and then forming wiring patterns 2242 and vias 2243. Then, a passivation layer 2250 protecting the connection member 2240 may be formed, and an opening 2251 may be formed to have an underbump metal layer 2260, or the like, extending therethrough. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals generally need to be disposed inside the semiconductor chip in the fan-in semiconductor package, the fan-in semiconductor package has a large spatial limitation. Therefore, it may be difficult to apply this structure to a semiconductor chip having a large number of I/O terminals or a semiconductor chip having a small size. In addition, due to the disadvantages described above, the fan-in semiconductor package may not be directly mounted and used on the main board of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
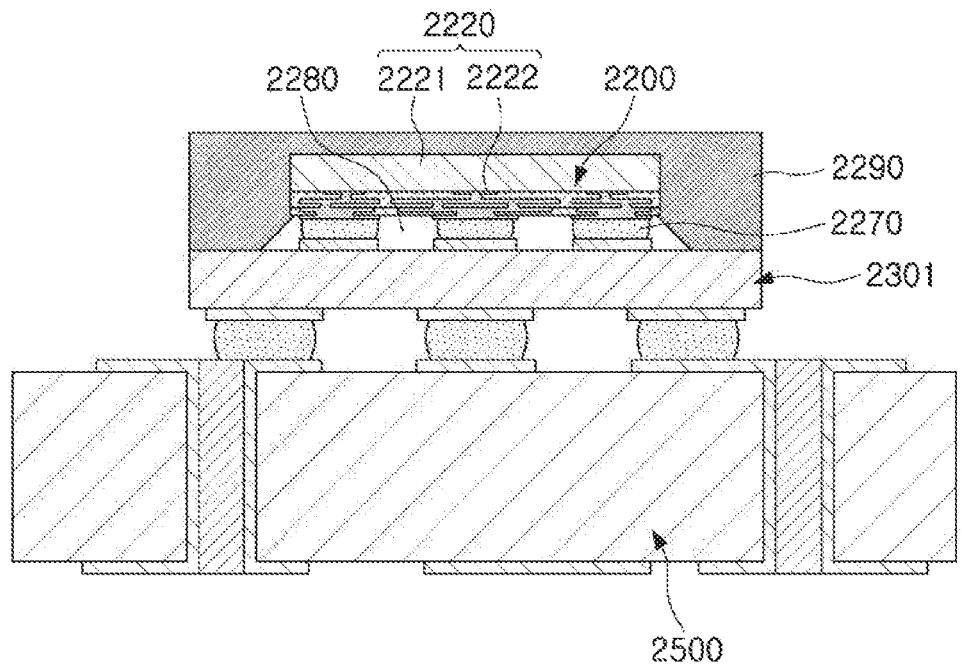
FIG. 5 is a schematic cross-sectional view illustrating a fan-in semiconductor package mounted on an interposer substrate and ultimately mounted on a main board of an electronic device.
Figure 6:
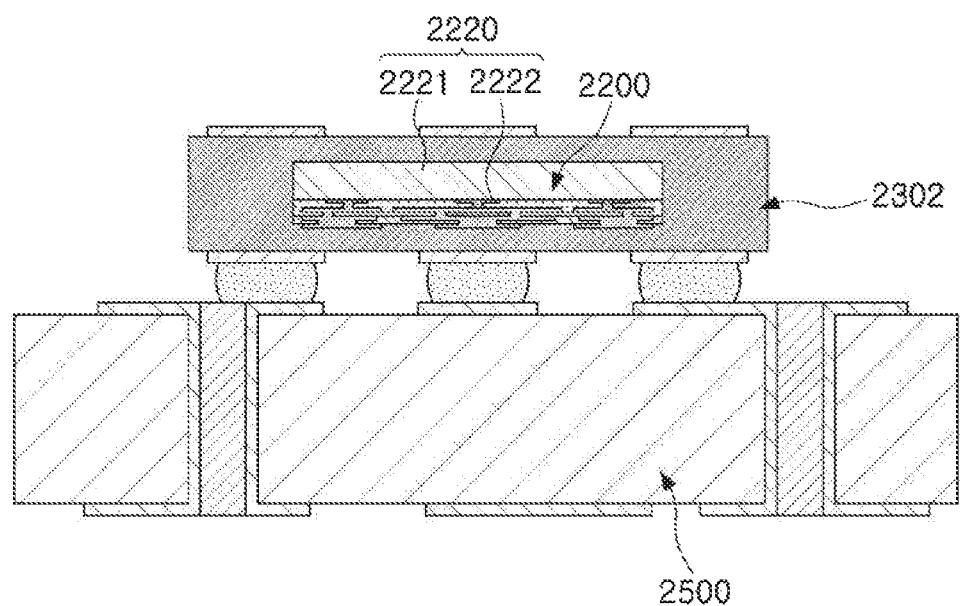
FIG. 6 is a schematic cross-sectional view illustrating a fan-in semiconductor package embedded in an interposer substrate and ultimately mounted on a main board of an electronic device.

FIG. 5 is a schematic cross-sectional view illustrating a fan-in semiconductor package mounted on an interposer substrate that is ultimately mounted on a main board of an electronic device, and FIG. 6 is a schematic cross-sectional view illustrating a fan-in semiconductor package embedded in an interposer substrate that is ultimately mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an external surface of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board (e.g., 2500) of the electronic device. Therefore, the fan-in semiconductor package may be mounted on the separate interposer substrate (e.g., 2301 or 2302) and be then mounted on the main board of the electronic device through a packaging process or may be mounted and used on the main board of the electronic device in a state in which it is embedded in the interposer substrate.

Fan-Out Semiconductor Package

Figure 7:
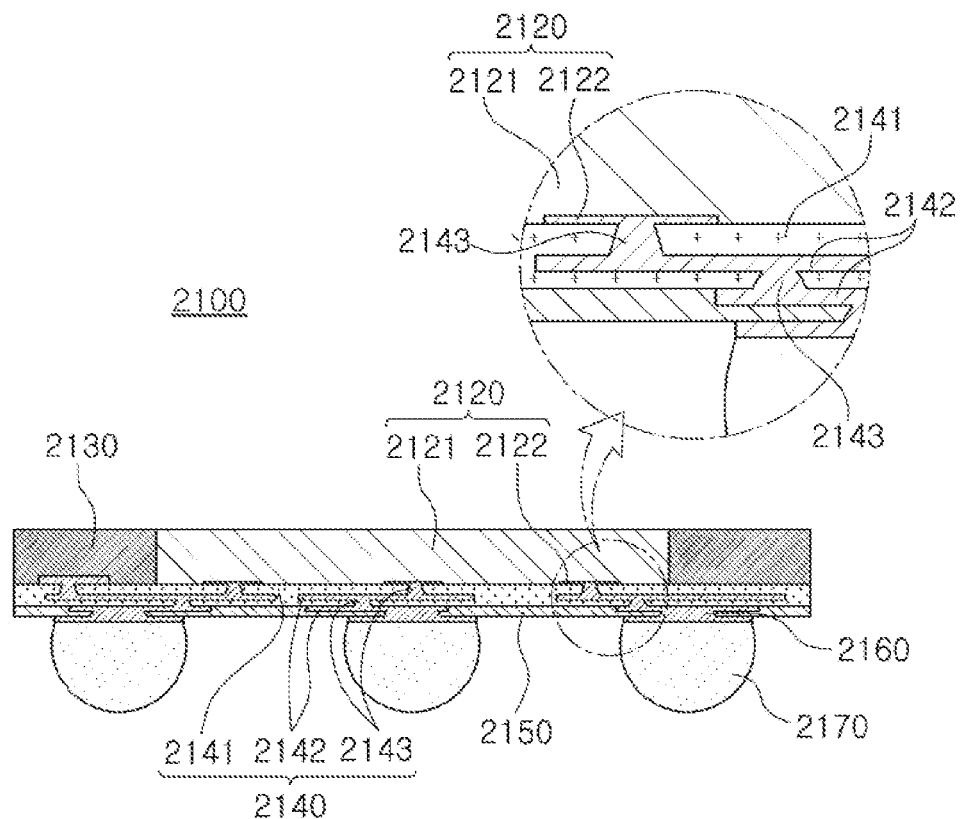
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for forming the connection member 2140 is performed to form the via(s) connecting the redistribution layers and the connection pads 2122 of the semiconductor chip 2120 to each other and the redistribution layers 2142, and the vias 2143 may thus have a width reduced toward the semiconductor chip 2120 (see an enlarged region).

As described above, the fan-out semiconductor package may have a form in which I/O terminals of the semiconductor chip are redistributed and disposed outwardly of the semiconductor chip 2120 through the connection member 2140 formed on the semiconductor chip 2120. As described above, in the fan-in semiconductor package, all I/O terminals of the semiconductor chip generally need to be disposed inside the semiconductor chip (e.g., within the footprint of the semiconductor chip on the package). Therefore, when a size of the semiconductor chip is decreased, a size and a pitch of balls generally need to be decreased, such that a standardized ball layout may not be used in the fan-in semiconductor package. On the other hand, the fan-out semiconductor package has the form in which the I/O terminals of the semiconductor chip 2120 are redistributed and disposed outwardly of the semiconductor chip 2120 (e.g., outwardly from the footprint of the semiconductor chip) through the connection member 2140 formed on the semiconductor chip as described above. Therefore, even in the case that a size of the semiconductor chip 2120 is decreased, a standardized ball layout may be used in the fan-out semiconductor package as it is, such that the fan-out semiconductor package may be mounted on the main board of the electronic device without using a separate interposer substrate, as described below.

Figure 8:
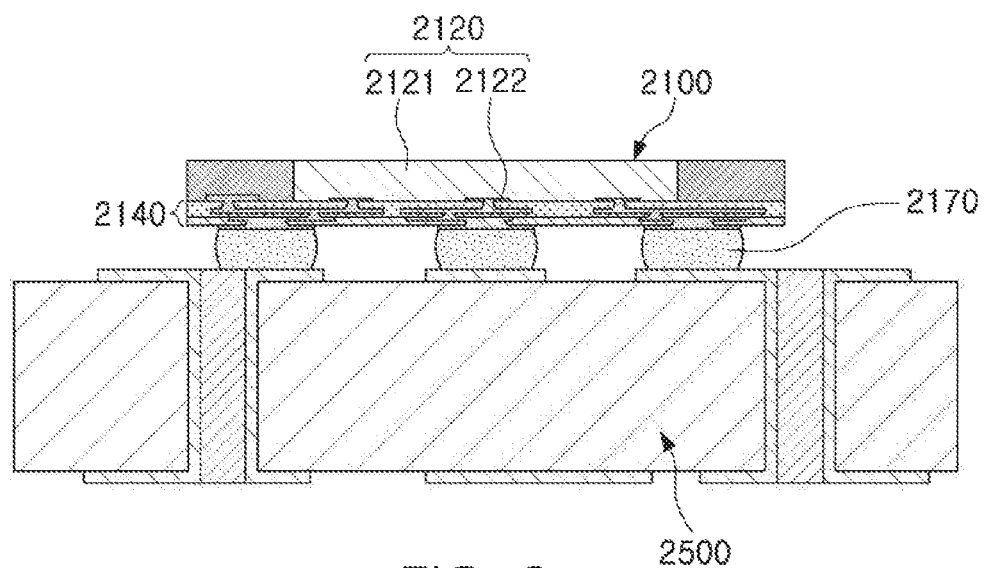
FIG. 8 is a schematic cross-sectional view illustrating a fan-out semiconductor package mounted on a main board of an electronic device.

FIG. 8 is a schematic cross-sectional view illustrating a fan-out semiconductor package mounted on a main board of an electronic device.

Referring to FIG. 8, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of an area/footprint of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem caused by the occurrence of a warpage phenomenon.

Meanwhile, the fan-out semiconductor package refers to a packaging technology for mounting the semiconductor chip on the main board of the electronic device, or the like, as described above, and protecting the semiconductor chip from external impacts. The fan-out semiconductor package is a concept different from that of a printed circuit board (PCB) such as an interposer substrate, or the like, having a scale, a purpose, and the like, different from those of the fan-out semiconductor package, and having the fan-in semiconductor package embedded therein.

Hereinafter, various exemplary embodiments of the present disclosure will be described in detail with reference to the accompanying drawings.

Figure 9:
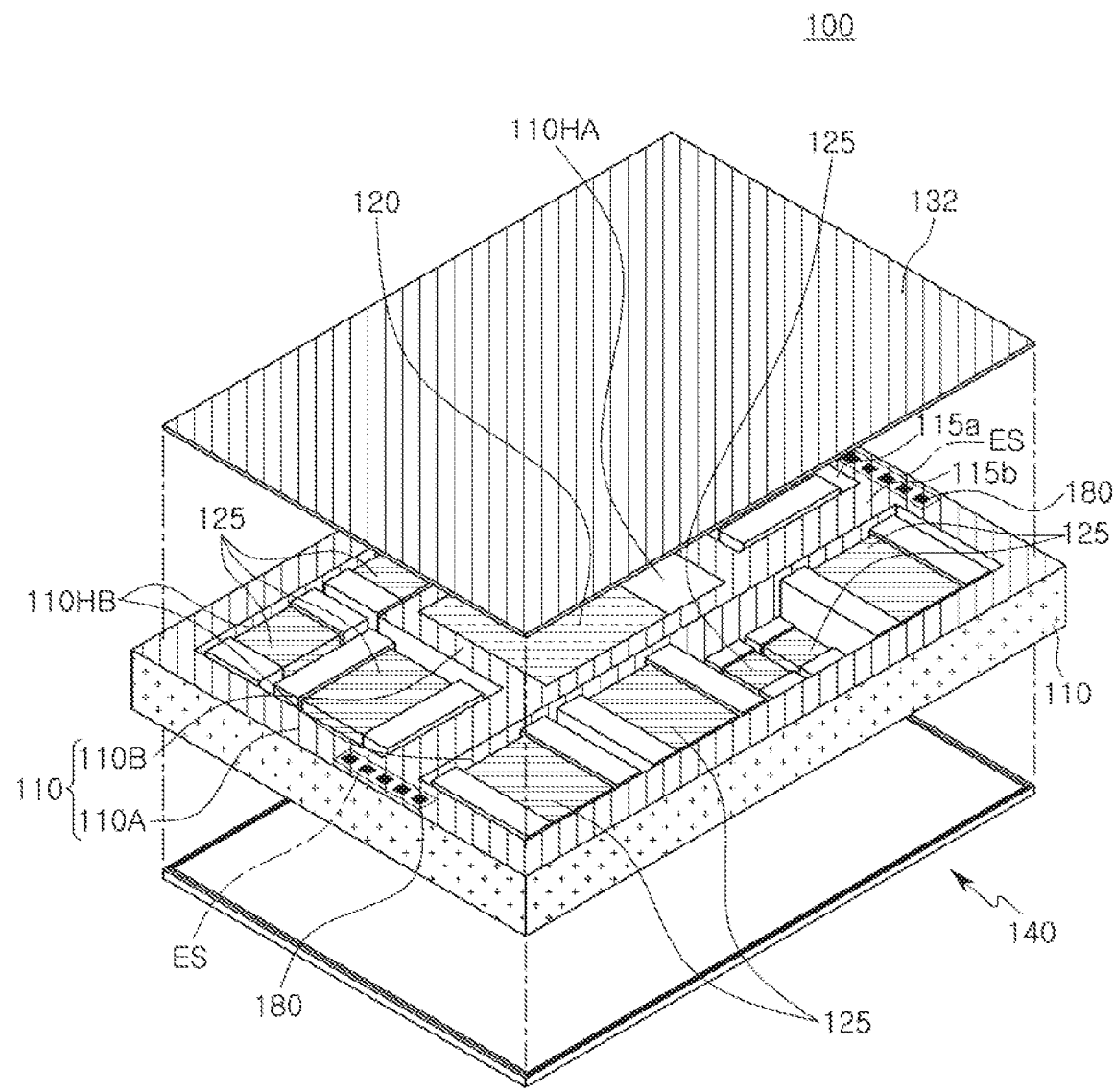
FIG. 9 is a schematic perspective view illustrating a semiconductor package according to an exemplary embodiment.
Figure 10:
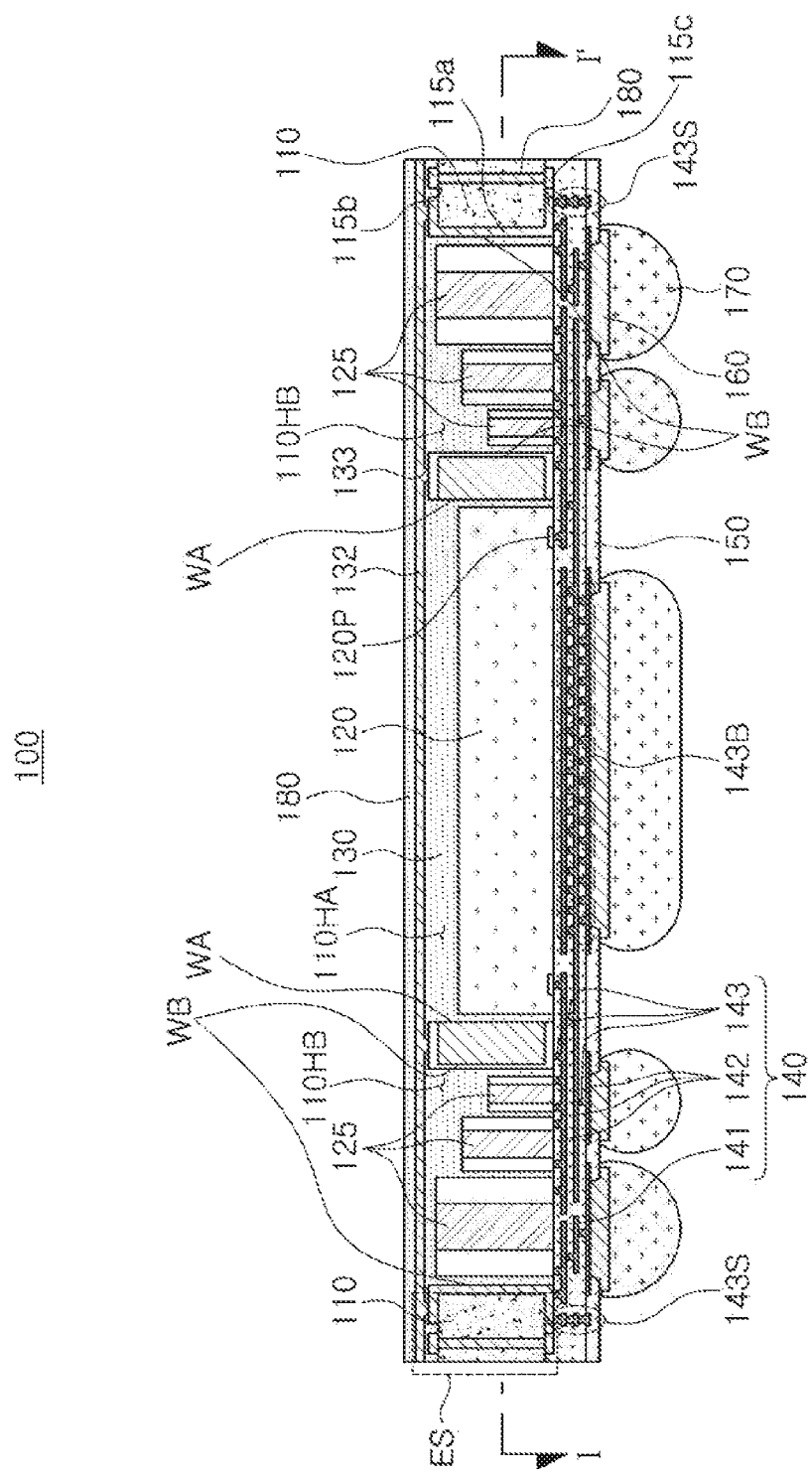
FIG. 10 is a schematic cross-sectional view illustrating the semiconductor package of FIG. 9.

FIG. 9 is a schematic exploded perspective view illustrating a semiconductor package according to an exemplary embodiment. FIG. 10 is a schematic cross-sectional view illustrating the semiconductor package of FIG. 9, and FIG. 11 is a plan view taken along line I-I' of the semiconductor package of FIG. 10.

Figure 11:
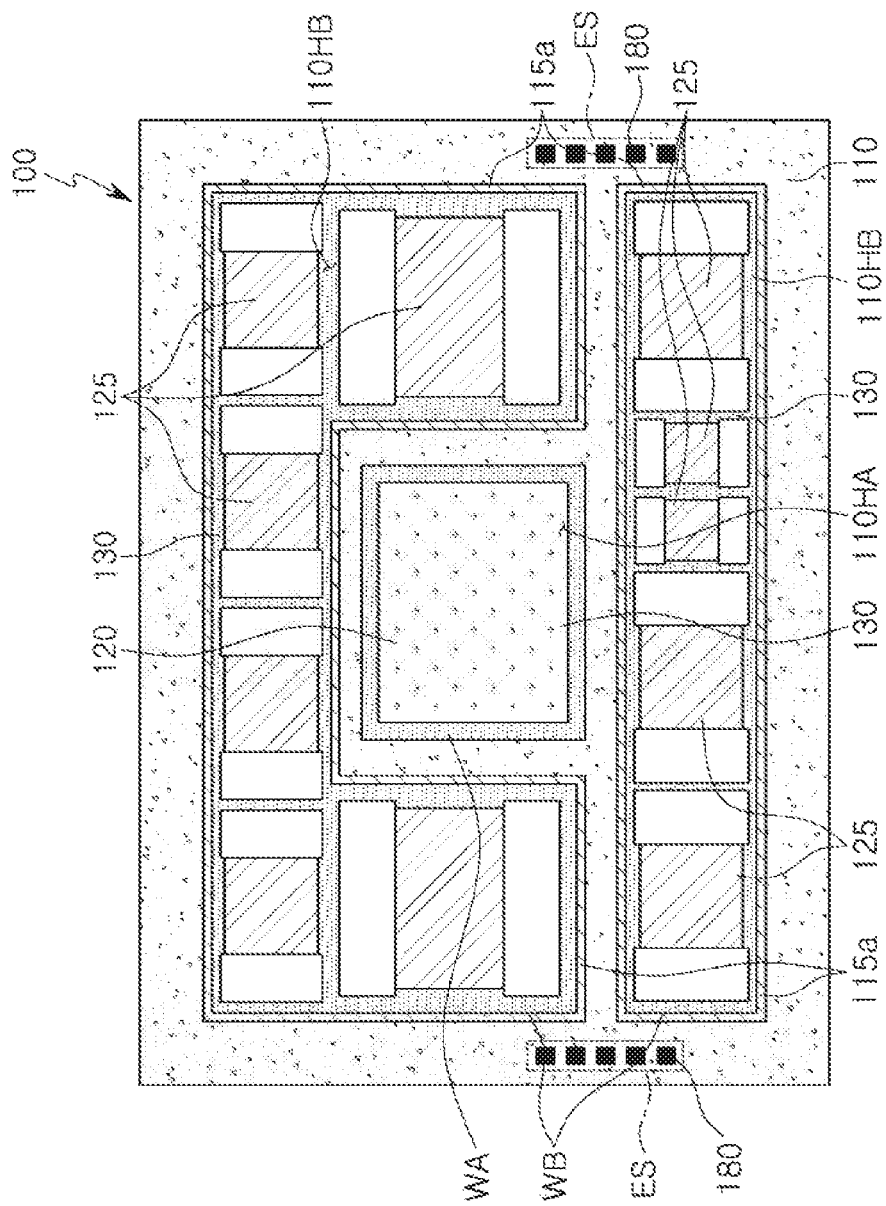
FIG. 11 is a plan view taken along line I-I' of the semiconductor package of FIG. 10.

Referring to FIGS. 9 through 11, a semiconductor package 100 according to the present exemplary embodiment may include a connection member 140 having first and second surfaces opposing each other, a supporting member 110 disposed on the first surface of the connection member 140 and having a first through-hole 110HA and one or more second through-hole(s) 110HB spaced apart from each other, a semiconductor chip 120 disposed in the first through-hole 110HA, a plurality of passive components 125 disposed in the second through-hole(s) 110HB, and an encapsulant 130 encapsulating the supporting member 110, the semiconductor chip 120, and the plurality of passive components 125.

The semiconductor chip 120 may include connection pads 120P connected to a redistribution layer 142 of the connection member 140 in the first through-hole 110HA. The plurality of passive components 125 may include connection terminals connected to the redistribution layer 142 of the connection member 140 in the second through-holes 110HB. In the present exemplary embodiment, the number of second through-holes 110HB may be two, and the plurality of passive components 125 may be mounted in the second through-holes 110HB.

A passivation layer 150 may be disposed on the second surface of the connection member 140, and an underbump metal layer 160 electrically connected to the redistribution layer 142 may be disposed in openings of the passivation layer 150. Electrical connection structures 170 may be electrically connected to the redistribution layer 142 through the underbump metal layer 160.

Recently, with an increase in a size of mobile apparatus displays, a need for increased battery capacity has developed. As part of providing increased battery capacity, the area occupied by the battery in the mobile apparatus has increased, and a need has therefore arisen to reduce a size of a printed circuit board (PCB) to make up for the increased area being occupied by the battery. To address this need, an area in which components are mounted has been reduced, such that an interest in modularization has continuously increased.

An example of the related art of mounting a plurality of components may include chip on board (COB) technology. COB is a mounting scheme in which individual passive components and a semiconductor package are mounted on a printed circuit board using surface-mount technology (SMT). However, while such a mounting approach has an advantage in terms of low cost, the approach uses a wide mounted area in order to maintain a minimum interval between components, electromagnetic interference (EMI) between the components is large, and a distance between the semiconductor chip and the components is great, such that electrical noise is increased.

However, in the semiconductor package 100 according to the present exemplary embodiment, the plurality of passive components 125 may be disposed together with the semiconductor chip 120 in a single package structure. Therefore, an interval between the components may be significantly reduced, and a mounted area occupied by the components on a main board such as a printed circuit board, or the like, may be reduced. In addition, electrical paths between the semiconductor chip 120 and the passive components 125 may be significantly reduced to suppress noise. Particularly, the semiconductor chip 120 and the plurality of passive components 125 may be disposed in the first and second through-holes 110HA and 110HB, respectively.

First metal layers 115a may be disposed as electromagnetic wave blocking elements on inner surfaces WB of the second through-holes 110HB. Second and third metal layers 115b and 115c may be formed as additional blocking elements on upper and lower surfaces of the supporting member 110, respectively. The second and third metal layers 115b and 115c may be connected to the first metal layers 115a to constitute a blocking element. The first to third metal layers 115a, 115b, and 115c may be formed by performing a plating process on the supporting member 110.

As described above, in the second through-holes 110HB, EMI blocking related to the plurality of passive components 125 may be implemented using the first metal layers 115a. The second metal layer 115b formed on the upper surface of the supporting member 110 may be connected to a rear metal layer 132 through rear vias 133. Resultantly, EMI above the semiconductor chip 120 and the plurality of passive components 125 may be effectively blocked.

On the other hand, an inner surface WA of the first through-hole 110HA in which the semiconductor chip 120 is disposed may be indirect contact with the encapsulant 130 without a blocking structure formed thereon.

Therefore, the semiconductor package may be relatively vulnerable to electromagnetic waves. The reason why the blocking structure is not disposed on the inner surface WA of the first through-hole 110HA as in the present exemplary embodiment is that a process of mounting the passive components 125 is performed before a process of mounting the relatively expensive semiconductor chip 120. In detail, the reason is that the second through-holes 110HB are formed and a plating process for a blocking structure may be performed, but it may be difficult to perform an additional plating process on the first through-hole 110HA after the process of mounting the passive components 125.

Therefore, the semiconductor package may be vulnerable to the electromagnetic wave generated by the semiconductor chip 120, and a countermeasure against the electromagnetic wave generated by the semiconductor chip 120 is desirable.

As such a countermeasure, the supporting member 110 used in the present exemplary embodiment may include electromagnetic band-gap (EBG) structures ES. The electromagnetic band-gap structure ES may include a plurality of EBG cells 180 arranged as repetitive patterns. The electromagnetic band-gap structure ES, which is an electromagnetic wave absorber formed of a filter circuit using fine patterns, may be distinguished from blocking layers (for example, the first to third metal layers 115a, 115b, and 115c) blocking the electromagnetic waves.

The electromagnetic band-gap structure ES used in the present exemplary embodiment may be implemented in a form in which it is mounted on a surface of the supporting member 110 or is embedded in the supporting member 110. As illustrated in FIG. 10, the electromagnetic band-gap structure ES may include conductive patterns respectively disposed on upper and lower surfaces of the supporting member 110 and/or vias, and may be formed together with a wiring structure for redistribution when the wiring structure is formed in the supporting member 110.

The electromagnetic band-gap structure ES may be implemented in various forms. For example, the electromagnetic band-gap structure ES may be formed in a two-layer or three-layer pattern structure, and various examples and principles of the EBG cells 180 constituting the electromagnetic band-gap structure ES will be described below with reference to FIGS. 14, 15, 16A, and 16B.

As illustrated in FIGS. 9 and 10, the rear metal layer 132 may be disposed on the encapsulant 130. The rear metal layer 132 may be connected to the second metal layer 115b through the rear vias 133 penetrating through at least portions of the encapsulant 130. A protective layer 155 may be disposed on the rear metal layer 132.

The respective components included in the semiconductor package 100 according to the present exemplary embodiment will hereinafter be described in more detail.

The supporting member 110 may improve rigidity of the second semiconductor package 100 depending on certain materials, and serve to secure uniformity of a thickness of an encapsulant 130. The supporting member 110 may have the first through-hole 110HA and one or more second through-hole(s) 110HB. The semiconductor chip 120 may be disposed in the first through-hole 110HA and the plurality of passive components 125 may be disposed in the one or more second through-hole(s) 110HB. The semiconductor chip 120 and the plurality of passive components 125 may be disposed to be spaced apart from walls of the first through-hole 110HA and the second through-hole(s) 110HB, respectively, by predetermined distances. The supporting member 110 may be modified, if necessary, and different numbers and shapes of first and second through-holes 110HA and 110HB may be used (see, e.g., FIGS. 17A through 17E).

A material of the supporting member 110 is not particularly limited. For example, an insulating material may be used as the material of the supporting member 110. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. Alternatively, a PID resin may also be used as the insulating material.

The supporting member 110 may include the first metal layers 115a disposed on the inner surfaces WB of the second through-hole(s) 110HB, and the first metal layers 115a may be disposed to surround the passive components 125. The second and third metal layers 115b and 115c may be disposed on the upper and lower surfaces of the supporting member 110, respectively, and may be connected to the first metal layers 115a. As described above, the first to third metal layers 115a, 115b, and 115c may implement EMI blocking structures (particularly, structures for the passive components 125). The first to third metal layers 115a, 115b, and 115c may be connected to ground (GND) patterns. For example, the first to third metal layers 115a, 115b, and 115c may be connected to ground patterns of the redistribution layer 142 of the connection member 140. A material of each of the first to third metal layers 115a, 115b, and 115c may be a conductive material such as copper (Cu), aluminum (Al), silver (Ag), tin (Sn), gold (Au), nickel (Ni), lead (Pb), titanium (Ti), or alloys thereof. The first to third metal layers 115a, 115b, and 115c may be formed by a plating process.

Figure 12:
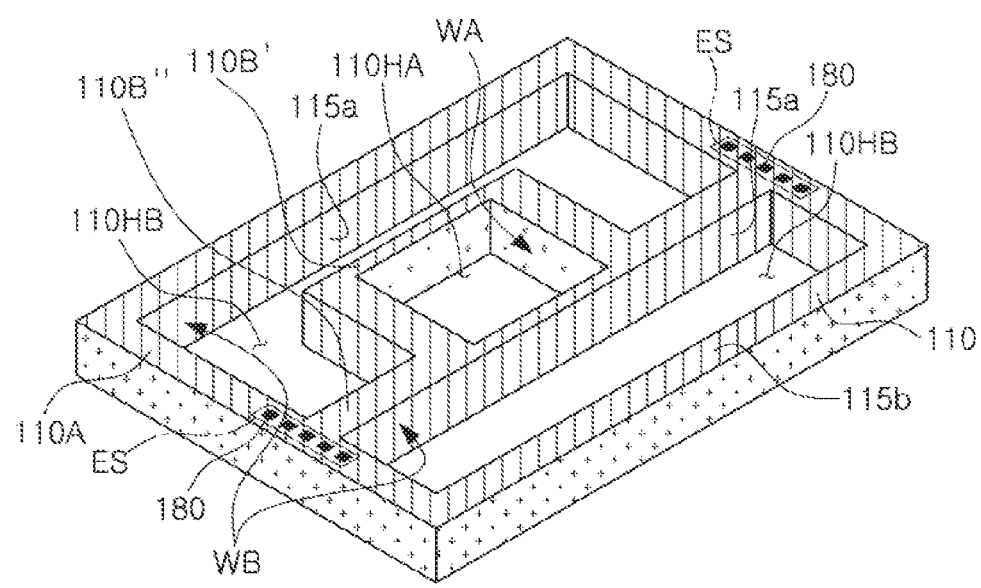
FIG. 12 is a schematic perspective view illustrating a layout of a metal layer (a blocking layer) and an electromagnetic band-gap (EBG) structure of a supporting member used in the semiconductor package of FIG. 9.

As illustrated in FIGS. 11 and 12, two second through-holes 110HB may be configured to surround the first through-hole 110HA.

The supporting member 110 used in the present exemplary embodiment may include an outer sidewall structure 110A defining a contour of the supporting member and an inner sidewall structure 110B extended from the outer sidewall structure 110A to an internal space and dividing the internal space into the first through-hole 110HA and the second through-hole(s) 110HB.

Since the outer sidewall structure 110A generally has a width greater than that of the inner sidewall structure 110B, it may be advantageous to form the electromagnetic band-gap structures ES in the outer sidewall structure 110A. Therefore, the electromagnetic band-gap structures ES may be disposed in regions of the outer sidewall structure 110A connected to the inner sidewall structure 110B.

Figure 13:
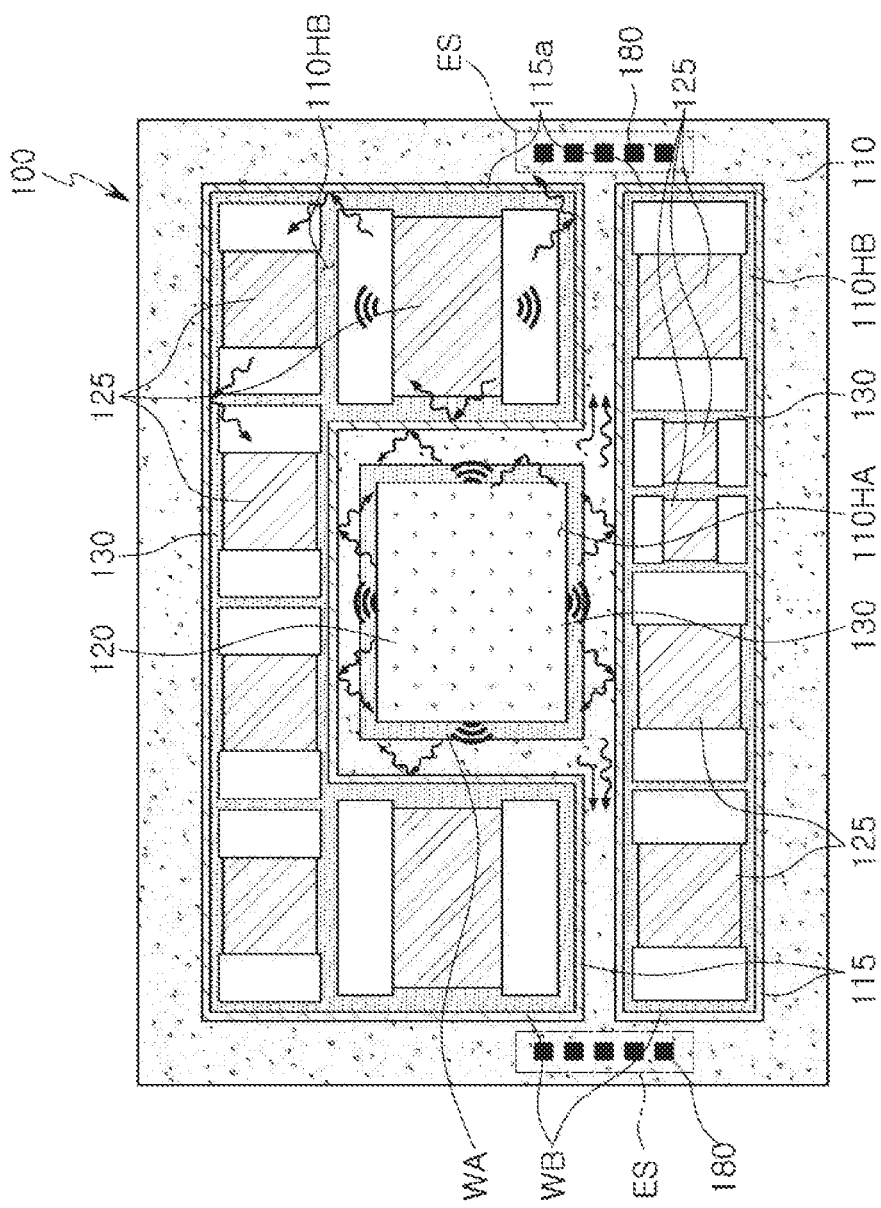
FIG. 13 is a plan view illustrating an effect of the metal layer (the blocking layer) and the EBG structure of the supporting member used in the semiconductor package of FIG. 9.

Referring to FIG. 13, electromagnetic waves emitted from the passive components may be blocked by the first metal layers 115a formed on the inner surfaces WB of the second through-hole(s) 110HB, such that they may not have an influence on passive components or the semiconductor chip disposed in other through-holes. However, since a metal layer is not formed on the inner surface WA of the first through-hole 110HA in which the semiconductor chip 120 is disposed, electromagnetic waves emitted from the semiconductor chip 120 may be absorbed by and propagated in a first inner sidewall structure 110B', and then may be absorbed by the electromagnetic band-gap structures, such that they may not have a negative influence on other components or other packages.

Referring to FIGS. 11 and 12, the inner sidewall structure may include the first inner sidewall structure 110B' surrounding the first through-hole 110HA and a second inner sidewall structure 110B" connecting the first inner sidewall structure 110B' and the outer sidewall structure 110A to each other.

That is, in the present exemplary embodiment, the electromagnetic band-gap structures ES may be disposed in regions of the outer sidewall structure 110A connected to the second inner sidewall structure 110B". Alternatively, the electromagnetic band-gap structures ES may be disposed in the second inner sidewall structure 110B", if necessary.

The supporting member 110 may have a wiring structure including conductor patterns and vias, if necessary. Therefore, the electromagnetic band-gap structure ES used in the present exemplary embodiment may be easily implemented using the conductor patterns and the vias implemented in the supporting member 110. For example, the electromagnetic band-gap structure ES may have a two-layer structure including the conductor patterns respectively disposed on the upper and lower surfaces of the supporting member 110 and/or the vias (see FIGS. 14 and 15).

Insulating layers constituting the supporting member 110 may be multiple layers, such that the electromagnetic band-gap structure ES may have multiple-layer conductor patterns. The electromagnetic band-gap structure ES may be implemented in various forms. For example, the electromagnetic band-gap structure ES may be formed in a three-layer or more pattern structure in addition to a two-layer pattern structure. Alternatively, the electromagnetic band-gap structure ES having a two-layer pattern structure may be stacked two times or more.

The wiring structure of the supporting member 110 may have a thickness greater than that of the redistribution layer 142 of the connection member 140. The supporting member 110 in which the wiring structure is implemented may be utilized as a package for a package-on-package (PoP).

The semiconductor chip 120 may be an integrated circuit (IC) provided with several hundreds to several millions of elements or more, integrated in a single chip. In this case, the integrated circuit may be, for example, a power management IC (PMIC), but is not limited thereto. Meanwhile, the semiconductor chip 120 may be an integrated circuit in a bare state in which a separate bump or redistribution layer is not formed. The integrated circuit may be formed on the basis of an active wafer. In this case, a base material of a body of the semiconductor chip 120 may be silicon (Si), germanium (Ge), gallium arsenide (GaAs), or the like. Various circuits may be formed on the body. The connection pads 120P may electrically connect the semiconductor chip 120 to other components. A material of each of the connection pads 120P may be a conductive material such as aluminum (Al), or the like. A passivation layer (not illustrated) exposing the connection pads 120P may be formed on the body, and may be an oxide film, a nitride film, or the like, or a double layer of an oxide layer and a nitride layer. An insulating layer (not illustrated), and the like, may be further disposed in other appropriate positions.

The plurality of passive components 125 may be multilayer ceramic capacitors (MLCCs), low inductance chip capacitors (LICCs), inductors, beads, or various other kinds of filters, or the like. The respective passive components 125 may have different sizes. In addition, the respective passive components 125 may have a thickness different from that of the semiconductor chip 120. In the semiconductor package 100 according to the present exemplary embodiment, the passive components 125 may be divided and arranged in the second through-holes 110HB.

The encapsulant 130 may encapsulate at least portions of the supporting member 110, the semiconductor chip 120, and the plurality of passive components 125. In addition, the encapsulant 130 may fill at least portions of the first through-hole 110HA and the second through-hole(s) 110HB. The encapsulant 130 may include an insulating material. The insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, or the like. In addition, the known molding material such as an epoxy molding compound (EMC), or the like, may be used, and a photoimageable encapsulant (PIE) may be used, if desired. Alternatively, a material in which an insulating resin such as a thermosetting resin or a thermoplastic resin is impregnated in an inorganic filler and/or a core material such as a glass fiber (or a glass cloth or a glass fabric) may also be used as the insulating material.

As described above, the metal layer is not formed on the inner surface of the first through-hole 110HA, and the inner surface WA of the first through-hole 110HA may thus be in contact with the encapsulant 130. In this case, it may be expected to improve the yield as described above.

The rear metal layer 132 may cover an upper portion of the encapsulant 130. The rear metal layer 132 may have a plate form. The rear metal layer 132 may be connected to the second metal layer 115b through the rear vias 133 penetrating through at least portions of the encapsulant 130. The rear metal layer 132 may also be used as a ground. A material of each of the rear metal layer 132 and the rear vias 133 may be a conductive material such as copper (Cu), aluminum (Al), silver (Ag), tin (Sn), gold (Au), nickel (Ni), lead (Pb), titanium (Ti), or alloys thereof. The rear metal layer 132 and the rear vias 133 may be formed by a plating process.

The connection pads 120P of the semiconductor chip 120 may be extended and redistributed using the connection member 140. In addition, the connection member 140 may electrically connect the semiconductor chip 120 and the passive components 125 to each other. Several tens to several hundreds of connection pads 120P of the semiconductor chip 120 having various functions may be redistributed by the connection member 140, and may be physically or electrically externally connected through the electrical connection structures 170 depending on the functions. The connection member 140 may include insulating layers 141, redistribution layers 142 disposed on the insulating layers 141, and vias 143 penetrating through the insulating layers 141 and connecting the redistribution layers 142 to each other. The connection member 140 may be formed of a single layer, or may be formed of multiple layers (e.g., formed of a greater number of layers than illustrated in the drawings).

A material of each of the insulating layers 141 may be an insulating material. In this case, a photosensitive insulating material such as a PID resin may also be used as the insulating material. That is, the insulating layer 141 may be a photosensitive insulating layer. When the insulating layer 141 has photosensitive properties, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 are formed as multiple layers, materials of the insulating layers 141 may be the same as each other, or may alternatively be different from each other, if desired. When multiple insulating layers 141 are used, the insulating layers 141 may be integrated with each other depending on a process, such that a boundary therebetween may also not be apparent.

The redistribution layers 142 may serve to substantially redistribute the connection pads 120P. The redistribution layers 142 may include, for example, a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include via pads, connection terminal pads, and the like.

The vias 143 may electrically connect the redistribution layers 142, the connection pads 120P, or the like, formed on different layers to each other, resulting in reconfiguration of an electrical path in the semiconductor package 100. The vias 143 may include, for example, a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, and may have various shapes such as a tapered shape or a cylindrical shape.

The connection member 140 may include a heat dissipation structure 143B disposed on an active surface of the semiconductor chip 120. The heat dissipation structure 143B may have a stack via form, but is not limited thereto. The heat dissipation structure 143B may be connected to the main board through the electrical connection structures 170 to effectively dissipate heat generated by the semiconductor chip 120.

The connection member 140 may have a blocking structure 143S surrounding the redistribution layers 142. The blocking structure 143S may be formed along an edge of the connection member 140 (e.g., a peripheral edge of the connection member 140). The blocking structure 143S may have stack vias, but is not limited thereto. The blocking structure 143S may be connected to the third metal layer 115c, but is not limited thereto. EMI generated by the redistribution layers 142 or EMI introduced from an external apparatus into the redistribution layers 142 may be effectively blocked by the blocking structure 143S.

The passivation layer 150 may protect the connection member 140 from external physical or chemical damage. The passivation layer 150 may have openings exposing at least portions of the redistribution layer 142 of the connection member 140. The number of openings formed in the passivation layer 150 may be several tens to several thousands. The passivation layer 150 may include an insulating resin and an inorganic filler, but may generally not include a glass fiber. For example, the passivation layer 150 may be formed of ABF, but is not limited thereto.

The underbump metal layer 160 may improve connection reliability of the electronic connection structures 170, resulting in improvement of board level reliability of the semiconductor package 100. The underbump metal layer 160 may be connected to the redistribution layer 142 of the connection member 140 exposed through the openings of the passivation layer 150. The underbump metal layer 160 may be formed in the openings of the passivation layer 150 by a metallization method using a conductive material such as a metal, but is not limited thereto.

The electrical connection structures 170 may be additionally configured to physically and/or electrically externally connect the semiconductor package 100. For example, the semiconductor device 100 may be mounted on the main board of the electronic device through the electrical connection structures 170. Each of the electrical connection structures 170 may be formed of a conductive material such as a solder, or the like. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, the electrical connection structures 170 are not limited thereto. The number, an interval, a disposition form, and the like, of electrical connection structures 170 are not particularly limited. For example, the electrical connection structures 170 may be provided in an amount of several tens to several thousands, according to the number of connection pads 120P, or may be provided in an amount of several tens to several thousands or more or several tens to several thousands or less.

At least some of the electrical connection structures 170 may be disposed in a fan-out region. The fan-out region refers to a region except for the region in which the semiconductor chip 120 is disposed (e.g., a region of a surface of the semiconductor package 100 that does not overlap with the position of the semiconductor chip 120 in the semiconductor package 100). A fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness.

The protective layer 155 may protect the rear metal layer 132 from external physical or chemical damage. The protective layer 155 may include a passivation layer including an insulating resin and an inorganic filler, but may not include a glass fiber. For example, the protective layer 155 may be formed of ABF, but is not limited thereto.

Various examples of the EBG structure ES that may be implemented in the supporting member 110 used in the present exemplary embodiment will hereinafter be described.

Figure 14:
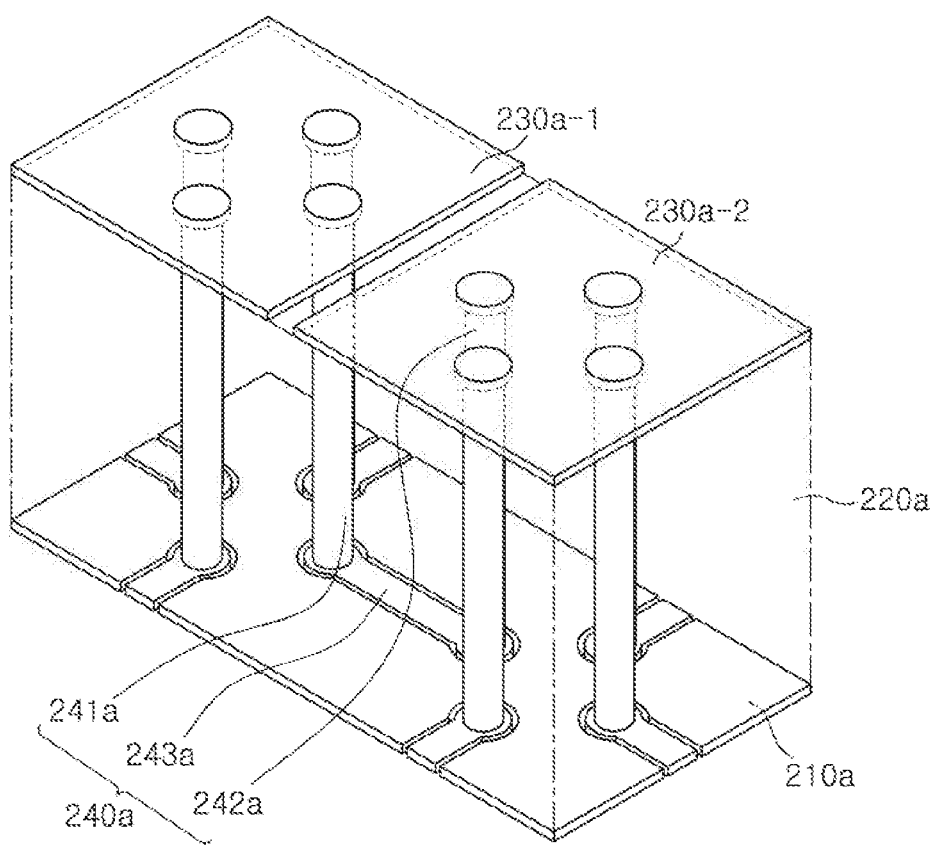
FIG. 14 is a view illustrating an example of an EBG cell constituting the EBG structure that may be used in the semiconductor package according to an exemplary embodiment.
Figure 15:
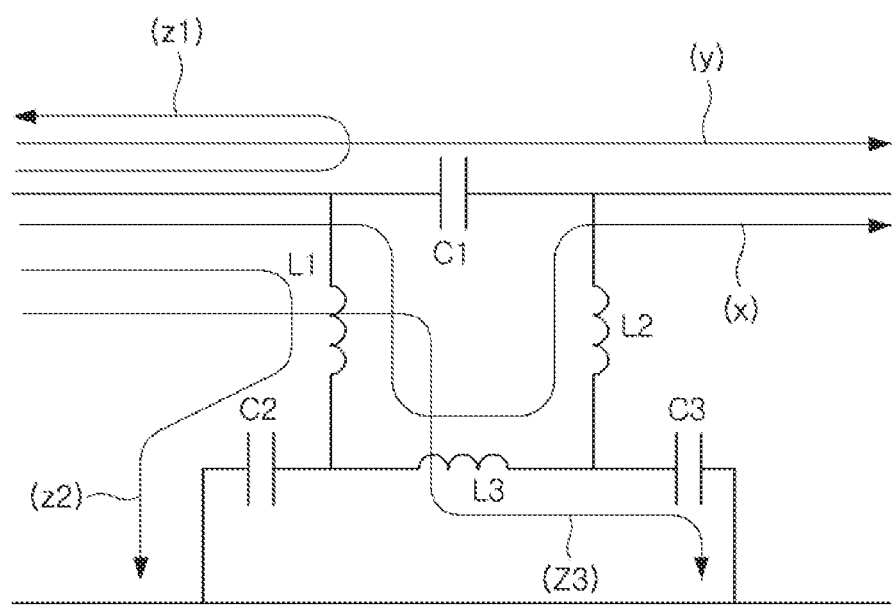
FIG. 15 is an equivalent circuit diagram of the EBG cell of FIG. 14.

FIG. 14 is a perspective view illustrating an example of an EBG cell constituting the EBG structure that may be used in the semiconductor package according to an exemplary embodiment in the present disclosure, and FIG. 15 is an equivalent circuit diagram of the EBG cell of FIG. 14.

Referring to FIG. 14, an EBG cell 280A according to the present exemplary embodiment may be a stitching via type EBG cell, and may include a first conductor pattern 210a disposed on a first level, a pair of second conductor patterns 230a-1 and 230a-2 disposed on a second level different from the first level, and a stitching via portion 240a. The stitching via portion 240a may be connected to the pair of second conductor patterns 230a-1 and 230a-2 through a plane on which the first conductor pattern 210a is disposed, and may be electrically disconnected from the first conductor pattern 210a.

The EBG cell illustrated in FIG. 14 may serve as an electromagnetic band-gap structure blocking signals in a specific frequency band. In detail, a dielectric layer 220a may be interposed between the first conductor pattern 210a and the pair of second conductor patterns 230a-1 and 230a-2. Therefore, capacitance components may exist between the first conductor pattern 210a and the pair of second conductor patterns 230a-1 and 230a-2 and between the pair of second conductor patterns 230a-1 and 230a-2 neighboring to each other. Here, the dielectric layer 220a may be the insulating layer constituting the supporting member 110.

In addition, in the stitching via portion 240a, inductance components passing through a first via 241a, a connection pattern 243a, and a second via 242a may also exist between the pair of second conductor patterns 230a-1 and 230a-2 neighboring to each other. In this case, values of the capacitance components may be changed by factors such as intervals between the first conductor pattern 210a and the pair of second conductor patterns 230a-1 and 230a-2 and between the pair of second conductor patterns 230a-1 and 230a-2 neighboring to each other, a dielectric constant of a dielectric material constituting the dielectric layer 220a, sizes, shapes, and areas of the conductor patterns, and the like. Values of the inductance components may also be changed by factors such as shapes, lengths, thicknesses, widths, cross-sectional areas, and the like, of the first via 241a, the second via 242a, and the connection patterns 243a.

Therefore, when the various factors described above are appropriately adjusted and designed, the structure illustrated in FIG. 14 may be utilized as an EBG cell for removing or blocking specific signals or specific noise in a target frequency band. That is, the structure illustrated in FIG. 14 may act as a band stop filter.

For example, in the semiconductor package illustrated in FIGS. 9 through 13, the first conductor pattern 210a may be disposed on a first level (for example, the lower surface) of the supporting member 110, and the pair of the second conductor patterns 230a-1 and 230a-2 may be disposed on a second level (for example, the upper surface) of the supporting member 110. The stitching via portion 240a may be a via penetrating through the supporting member 110.

Such an action will hereinafter be described with reference to the equivalent circuit diagram of FIG. 15.

Referring to FIG. 15, an inductance component L1 may correspond to the first via 241a, an inductance component L2 may correspond to the second via 242a, and an inductance component L3 may correspond to the connection pattern 243a. C1 may be a capacitance component formed by the pair of second conductor patterns 230a-1 and 230a-2 and any other dielectric layer and a first conductor pattern 210a that are to be disposed on a level above the pair of second conductor patterns 230a-1 and 230a-2, and C2 and C3 may be capacitance components formed by the first conductor pattern 210a disposed on the same level as a level on which the connection pattern 243a is disposed and any other dielectric layer and a first conductor pattern 210a that are to be disposed on a level below the level on which the connection pattern 243a is disposed.

According to such an equivalent circuit diagram, the EBG cell 280a of FIG. 14 may serve as the band stop filter blocking the signals in the specific frequency band. That is, as illustrated in FIG. 15, a signal (see reference numeral (x)) in a low frequency band and a signal (see reference numeral (y)) in a high frequency band may pass through the electromagnetic band-gap structure, and signals (see reference numerals (z1), (z2), and (z3)) in a specific frequency band between the low frequency band and the high frequency band may be blocked by the EBG cell.

Other examples of the EBG structure may include a coplanar type EBG 280B, which is an example of a two-layer structure, and a mushroom type EBG 280C, which is an example of a three-layer structure.

The coplanar type EBG 280B according to the present example may have a structure in which plural (for example, four) EBG cells having specific patterns are repeatedly disposed over the entirety of any one metal layer that is to serve as a power layer or a ground layer.

Figure 16A:
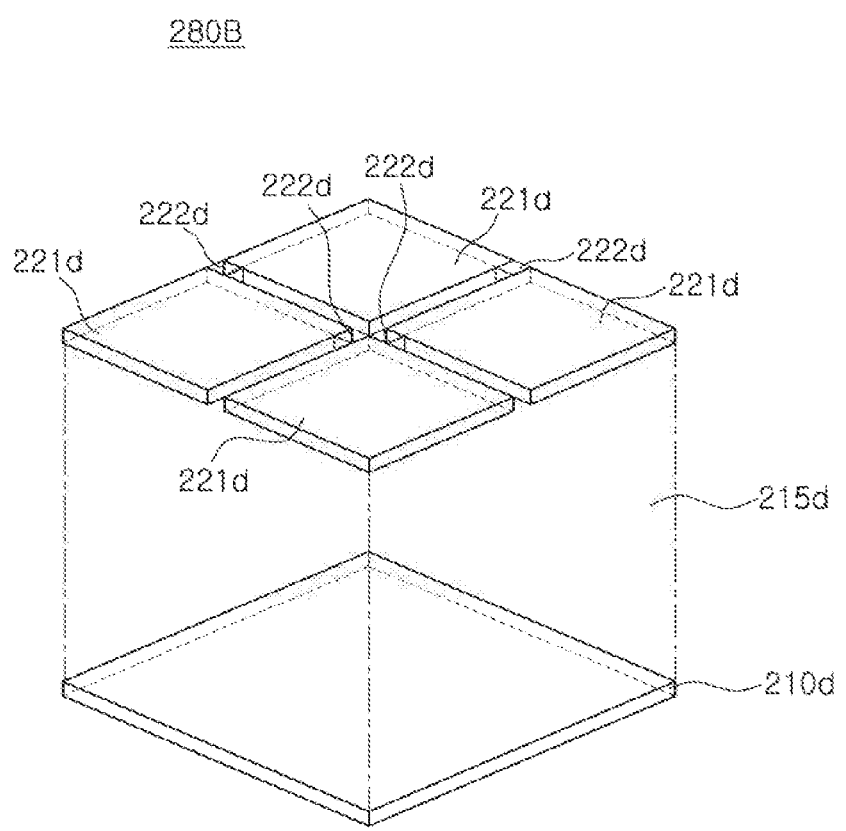
FIGS. 16A and 16B are views illustrating various examples of the EBG structures that may be used in the semiconductor package according to an exemplary embodiment.

Referring to FIG. 16A, the coplanar type EBG 280B may have a form in which a plurality of metal plates 221d disposed on a plane different from a plane on which any one metal layer 210d is disposed are connected to each other in a bridge form by metal branches 222d through specific portions (for example, distal ends of corners of the respective metal plates). The planes having the metal plates 221 and 210d may be separated by a space or layer 215d (e.g., a dielectric layer).

In this case, the metal plates 221d having a wide area may constitute low impedance regions, and the metal branches 222d having a narrow area may constitute high impedance regions. Therefore, the coplanar type EBG 280B may serve as a band stop filter that may block noise in a specific frequency band through a structure in which the low impedance regions and the high impedance regions are repeatedly alternately formed.

The coplanar type EBG 280B may have an advantage that an electromagnetic band-gap may be configured in a two-layer structure, and may be implemented in the supporting member 110, similar to the EBG cell 280A illustrated in FIG. 14.

Figure 16B:
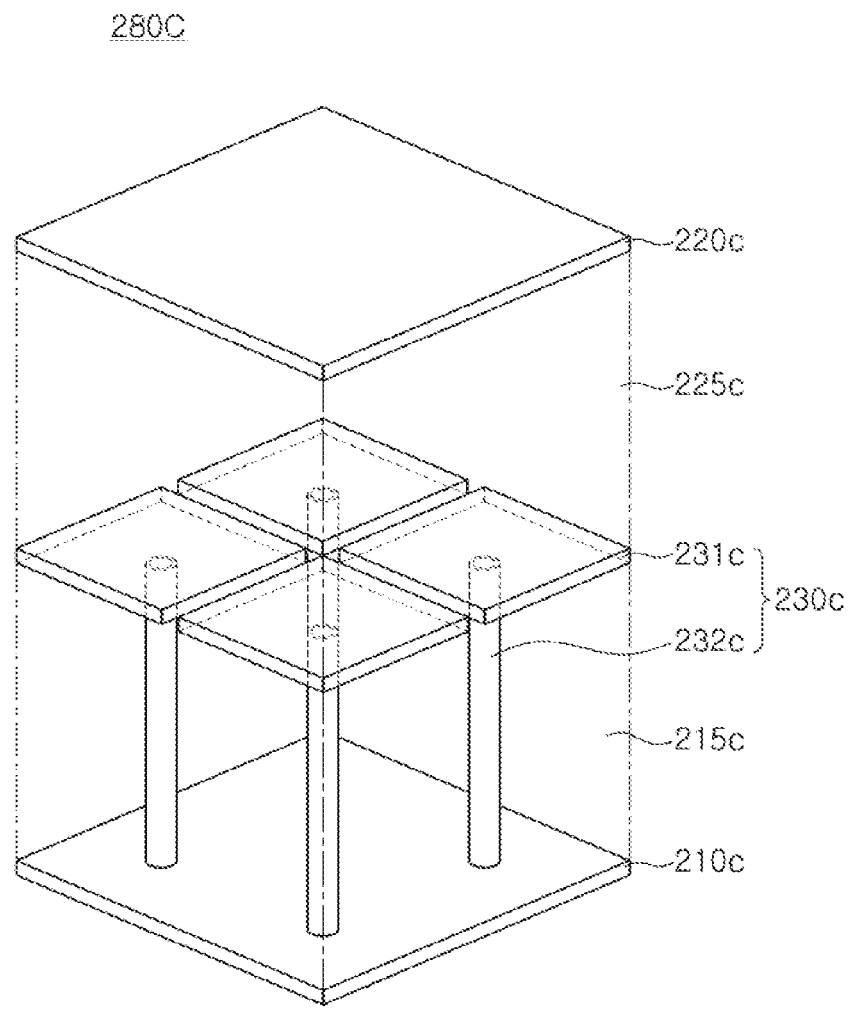

Referring to FIG. 16B, the mushroom type EBG 280C may have, for example, a structure in which plural (for example, four) EBG cells having a mushroom shape are inserted between two metal layers 210c and 220c that are to serve as a power layer and a ground layer.

The mushroom type EBG 280C may have a form in which a metal plate 231c is further formed between a first metal layer 210c and a second metal layer 220c serving as any one and the other of the ground layer and the power layer, respectively, and mushroom type structures 230c connecting the first metal layer 210c and the metal plate 231c to each other by vias 232c are repeatedly disposed.

In this case, a first dielectric layer 215c may be interposed between the first metal layer 210c and the metal plate 231c, and a second dielectric layer 225c may be interposed between the metal plate 231c and the second metal layer 220c. The mushroom type EBG 280C as described above may serve as a kind of band stop filter by having a state in which capacitance components formed by the second metal layer 220c, the second dielectric layer 225c, and the metal plate 231c and inductance components formed by the vias 232c penetrating through the first dielectric layer 215c to connect the first metal layer 210c and the metal plate 231c to each other are connected to each other in series (L-C series connection) between the first metal layer 210c and the second metal layer 220c.

The supporting member that may be used in the semiconductor package according to the present exemplary embodiment may have various structures, and the electromagnetic band-gap structures may thus have various arrays.

As in the previous exemplary embodiment, a first through-hole in which a semiconductor chip is disposed may be substantially disposed at the center, and a plurality of second through-holes may be arranged to surround the first through-hole. Also in this form, the supporting member may have various structures (see FIGS. 17A through 17E). However, the supporting member is not limited thereto.

All the supporting members 110 used in various exemplary embodiments may commonly include an outer sidewall structure 110A defining a contour of the supporting member 110, a first inner sidewall structure 110B' surrounding the first through-hole 110HA, and a second inner sidewall structure 110B" connected from the first inner sidewall structure 110B' to the outer sidewall structure 110A. The second inner sidewall structure 110B" may variously define sizes and shapes of the second through-holes 110HB. The supporting members having several structures may have various arrays of the electromagnetic band-gap (EBG) structures.

FIGS. 17A through 17E are plan views illustrating various examples of the supporting member of the semiconductor package according to an exemplary embodiment.

Figure 17A:
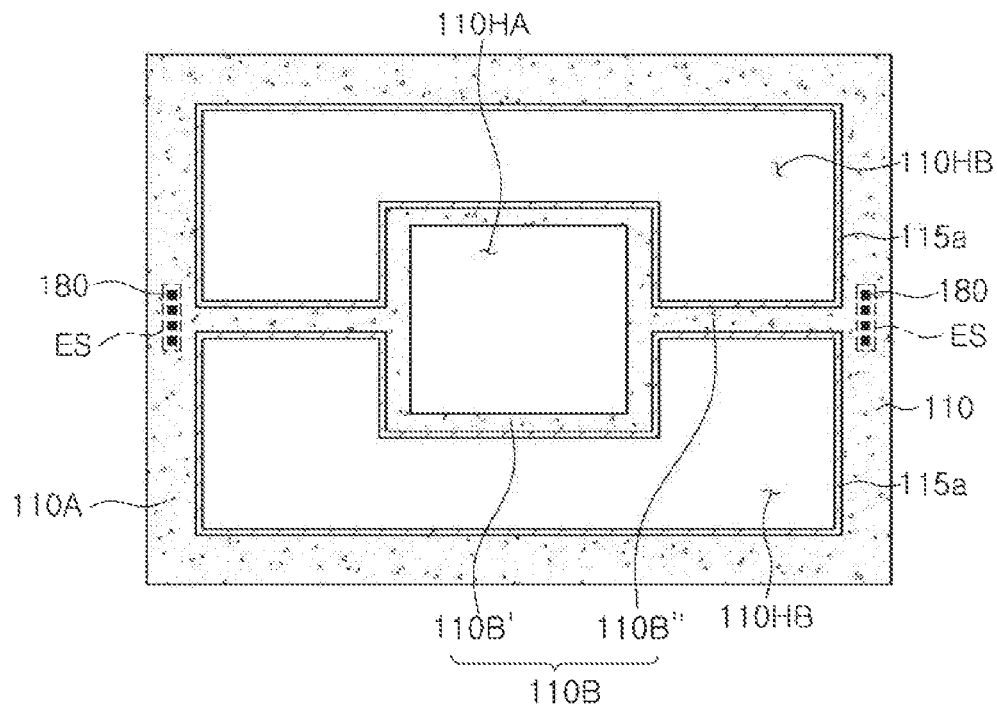
FIGS. 17A through 17E are plan views illustrating various examples of the supporting member of the semiconductor package according to an exemplary embodiment.

Referring to FIG. 17A, the supporting member 110 may have a first through-hole 110HA substantially disposed at the center and two second through-holes 110HB. The two second through-holes 110HB may be disposed above and below the first through-hole 110HA, and two second inner sidewall structures 110B" having the same size and shape may be formed. First metal layers 115a may be formed on inner surfaces of the second through-holes 110HB in which passive components are to be mounted, and a metal layer may not be formed on an inner surface of the first through-hole 110HA. Here, two electromagnetic band-gap structures ES may be disposed, respectively, in two regions of the outer sidewall structure 110A connected to (e.g., adjacent or proximate to) the second inner sidewall structure 110B".

Figure 17B:
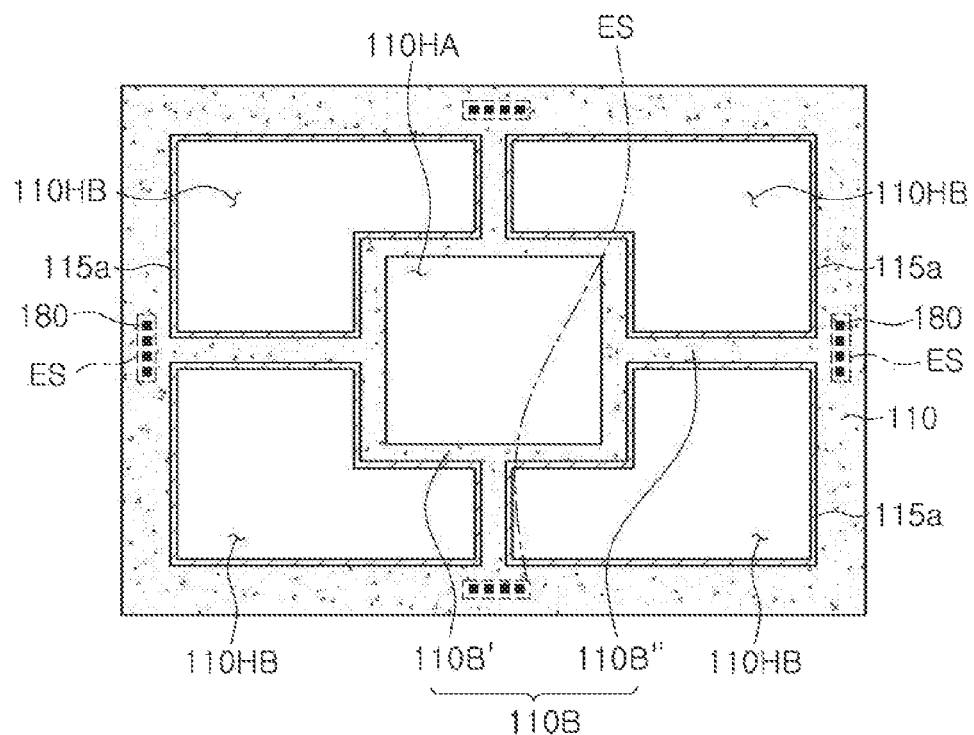

Referring to FIG. 17B, the supporting member 110 may have a first through-hole 110HA substantially disposed at the center and four second through-holes 110HB. The four second through-holes 110HB may be disposed at the respective corners of the first through-hole 110HA, and four second inner sidewall structures 110B" having the same size and shape may be formed. First metal layers 115a may be formed on inner surfaces of the second through-holes 110HB in which passive components are to be mounted, and a metal layer may not be formed on an inner surface of the first through-hole 110HA. Here, four electromagnetic band-gap structures ES may be disposed, respectively, in four regions of the outer sidewall structure 110A connected to the second inner sidewall structure 110B".

Figure 17C:
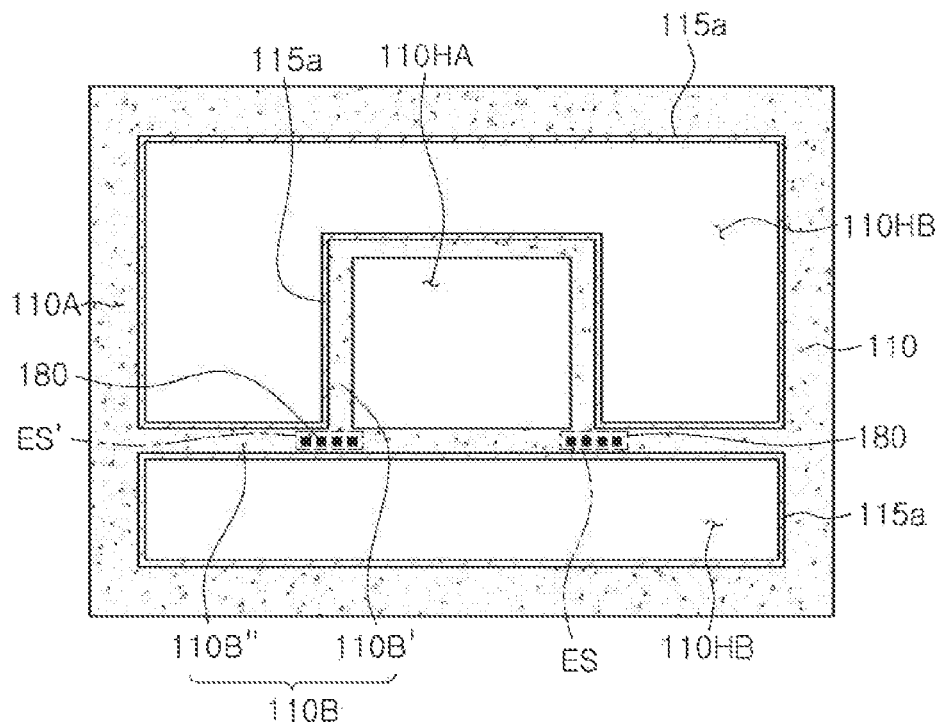

Referring to FIG. 17C, the supporting member 110 may have a first through-hole 110HA substantially disposed at the center and two second through-holes 110HB. The two second through-holes 110HB may be disposed above and below the first through-hole 110HA, and two second inner sidewall structures 110B" having different sizes and shapes may be formed. First metal layers 115a may be formed on inner surfaces of the second through-holes 110HB in which passive components are to be mounted, and a metal layer may not be formed on an inner surface of the first through-hole 110HA. Unlike the previous examples, electromagnetic band-gap structures ES introduced in the present example may be disposed, respectively, in two regions of the second inner sidewall structure 110B" connected to the first inner sidewall structure 110B'.

Figure 17D:
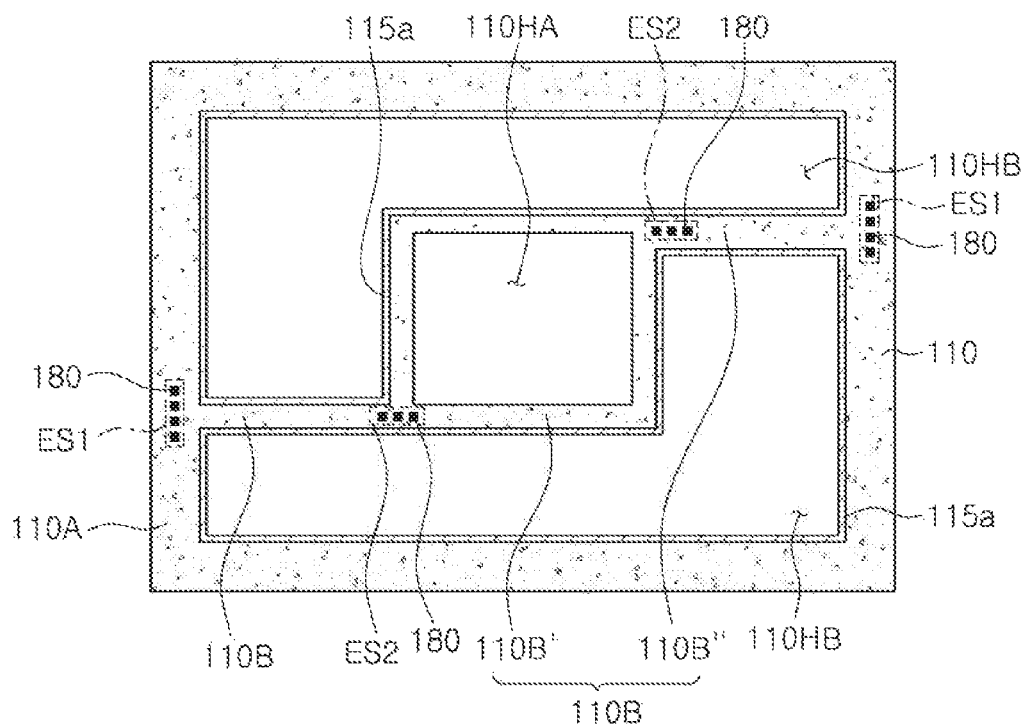

Referring to FIG. 17D, the supporting member 110 may have a first through-hole 110HA substantially disposed at the center and two second through-holes 110HB. The two second through-holes 110HB may be disposed above and below the first through-hole 110HA, and two second inner sidewall structures 110B" having a symmetrical structure in a diagonal direction may be formed. First metal layers 115a may be formed on inner surfaces of the second through-holes 110HB in which passive components are to be mounted, and a metal layer may not be formed on an inner surface of the first through-hole 110HA.

Similar to the examples illustrated in FIGS. 17A and 17B, two first electromagnetic band-gap structures ES1 may be disposed, respectively, in two regions of the outer sidewall structure 110A connected to the second inner sidewall structure 110B". Meanwhile, like the example illustrated in FIG. 17C, two second electromagnetic band-gap structures ES2 may be disposed, respectively, in two regions of the second inner sidewall structure 110B" connected to the first inner sidewall structure 110B'. In the present example, an electromagnetic wave absorbing action may be further improved using double electromagnetic wave absorbing structures of the first electromagnetic band-gap structures ES1 and the second electromagnetic band-gap structures ES2.

Figure 17E:
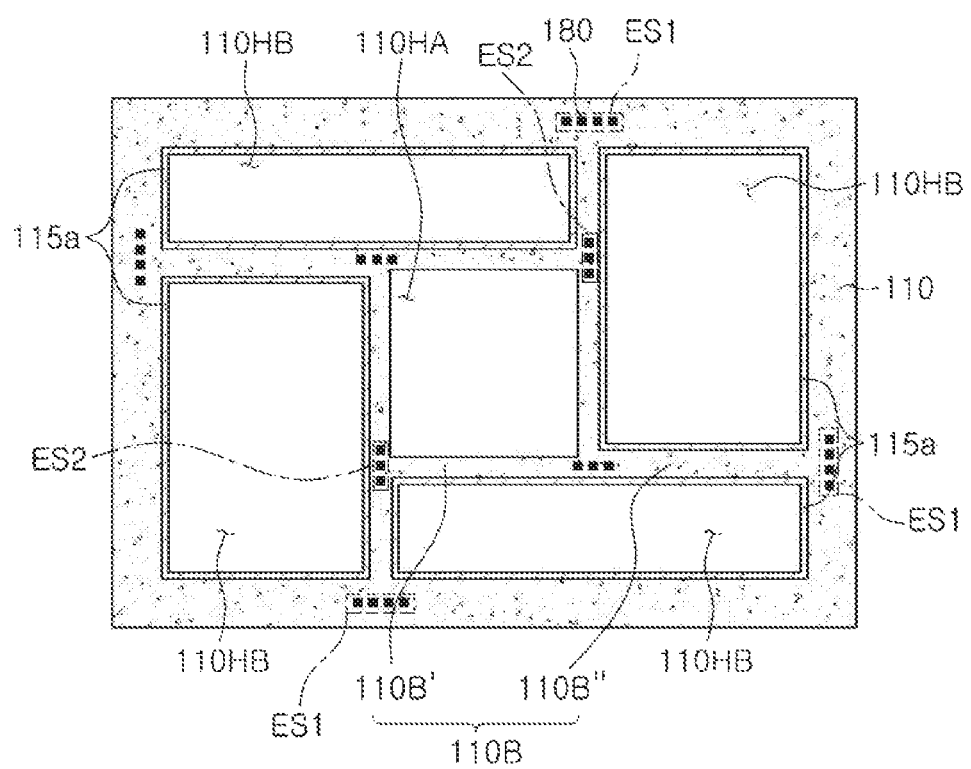

Referring to FIG. 17E, the supporting member 110 may have a first through-hole 110HA substantially disposed at the center and four second through-holes 110HB. The four second through-holes 110HB may be disposed to be symmetrical to each other in a vertical direction and a horizontal direction in relation to the first through-hole 110HA, and two second inner sidewall structures 110B" symmetrical to each other in the vertical direction and having the same shape and two second inner sidewall structures 110B" symmetrical to each other in the horizontal direction and having the same shape may be formed. First metal layers 115a may be formed on inner surfaces of the second through-holes 110HB in which passive components are to be mounted, and a metal layer may not be formed on an inner surface of the first through-hole 110HA.

Similar to the previous examples, four first electromagnetic band-gap structures ES1 may be disposed, respectively, in four regions of the outer sidewall structure 110A connected to the second inner sidewall structure 110B", and four second electromagnetic band-gap structures ES2 may be disposed, respectively, in four regions of the second inner sidewall structure 110B" connected to the first inner sidewall structure 110B'. Also in the present example, an electromagnetic wave absorbing action may be further improved using double electromagnetic wave absorbing structures of the first electromagnetic band-gap structures ES1 and the second electromagnetic band-gap structures ES2.

As set forth above, according to the exemplary embodiments, the semiconductor package provides significantly reduced EMI noise through the use of the electromagnetic band-gap structure that is an EMI absorbing structure formed in a region (that is, a sidewall structure) of the supporting member to improve an EMI vulnerable region (for example, a region around the semiconductor chip) to which it may be difficult to apply an EMI blocking structure.

The electromagnetic band-gap structure that may be used in the present exemplary embodiments may be easily formed at a desired position using the conductor patterns of the supporting member.

While exemplary embodiments have been shown and described above, it will be apparent to those skilled in the art that modifications and variations could be made without departing from the scope of the present invention as defined by the appended claims.

What is claimed is:
1. A semiconductor package comprising:
a connection member having first and second surfaces opposing each other and including a redistribution layer;
a supporting member disposed on the first surface of the connection member and having a first through-hole and a plurality of second through-holes;
electromagnetic wave blocking layers disposed on inner surfaces of the plurality of second through-holes and not disposed on an inner surface of the first through-hole;
a semiconductor chip disposed in the first through-hole and having connection pads connected to the redistribution layer; and
a plurality of passive components disposed in the plurality of second through-holes and having connection terminals connected to the redistribution layer,
wherein the supporting member includes an outer sidewall structure defining a contour of the supporting member, a first inner sidewall structure surrounding the first through-hole, and a second inner sidewall structure connected between the first inner sidewall structure and the outer sidewall structure, and an electromagnetic band-gap (EBG) structure is further disposed in at least one of the second inner sidewall structure and a region of the outer sidewall structure adjacent to the second inner sidewall structure.

2. The semiconductor package of claim 1, wherein the supporting member includes a plurality of second inner sidewall structures connected between the first inner sidewall structure and the outer sidewall structure, and a plurality of EBG structures are each disposed in a respective region of the outer sidewall structure adjacent to a respective one of the plurality of second inner sidewall structures.

3. The semiconductor package of claim 1, wherein the supporting member includes a plurality of second inner sidewall structures connected between the first inner sidewall structure and the outer sidewall structure, and a plurality of EBG structures are each disposed in a respective second inner sidewall structure of the plurality of second inner sidewall structures.

4. The semiconductor package of claim 1, further comprising a rear metal layer disposed on a surface of the supporting member facing away from the connection member and connected to the electromagnetic wave blocking layers.

5. The semiconductor package of claim 1, wherein the electromagnetic wave blocking layers are electrically connected to vias of the redistribution layer.

6. A semiconductor package comprising:
a connection member having first and second surfaces opposing each other and including a redistribution layer; and
a supporting member disposed on the first surface of the connection member to have a first surface thereof on the first surface of the connection member and to have a second surface opposing the first surface, the supporting member having a plurality of through-holes extending from the first surface to the second surface thereof, and the plurality of through-holes including a first through-hole spaced apart from side surfaces of the supporting member and at least one second through-hole disposed between the first through-hole and each side surface of the supporting member,
wherein a conductive metal layer is disposed on inner surfaces of the at least one second through-hole disposed between the first through-hole and each side surface of the supporting member.

7. The semiconductor package of claim 6, wherein the redistribution layer of the connection member provides electrical connections between the first through-hole and the at least one second through-hole, and between the first through-hole and the second surface of the connection member.

8. The semiconductor package of claim 6, wherein inner surfaces of the first through-hole are free of any conductive metal layer.

9. The semiconductor package of claim 6, wherein the supporting member includes:
an outer sidewall structure defining a contour of the supporting member; and
an inner sidewall structure dividing the first through-hole from the at least one second through-hole.

10. The semiconductor package of claim 9, wherein a portion of the inner sidewall structure extends to the outer sidewall structure, and the semiconductor package further comprises an electromagnetic band-gap (EBG) structure embedded in the outer sidewall structure at a position adjacent to the portion of the inner sidewall structure extending to the outer sidewall structure.

11. The semiconductor package of claim 9, further comprising an electromagnetic band-gap (EBG) structure embedded in the inner sidewall structure.

12. The semiconductor package of claim 11, wherein the EBG structure includes conductor patterns formed in the supporting member and having a two-layer structure with vias disposed between layers of the two-layer structure.

13. A semiconductor package comprising:
a connection member having first and second surfaces opposing each other and including a redistribution layer;
a supporting member disposed on the first surface of the connection member, having a first through-hole and a second through-hole spaced apart from each other, and having a blocking layer disposed on at least an inner surface of the second through-hole;
a semiconductor chip disposed in the first through-hole and having connection pads connected to the redistribution layer;
at least one passive component disposed in the second through-hole and having connection terminals connected to the redistribution layer;
an encapsulant encapsulating the semiconductor chip and the at least one passive component in the first and second through-holes, respectively; and
an electromagnetic band-gap (EBG) structure embedded in the supporting member.

14. The semiconductor package of claim 13, wherein the blocking layer includes a first metal layer disposed on the inner surface of the second through-hole, and second and third metal layers connected to the first metal layer and disposed on upper and lower surfaces of the supporting member, respectively.

15. The semiconductor package of claim 13, wherein the connection member includes a first stack via connected to a third metal layer of the blocking layer.

16. The semiconductor package of claim 13, wherein the connection member includes a second stack via disposed in a region corresponding to the semiconductor chip.

17. The semiconductor package of claim 13, further comprising a metal plate disposed on an upper surface of the supporting member and connected to a second metal layer of the blocking layer.

18. The semiconductor package of claim 13, wherein the electromagnetic band-gap structure includes an array of a plurality of EBG cells.

19. The semiconductor package of claim 18, wherein each of the plurality of EBG cells includes a first conductor pattern disposed on a lower surface of the supporting member, a second conductor pattern disposed on an upper surface of the supporting member, and a third conductor pattern disposed in the supporting member.

20. The semiconductor package of claim 18, wherein each of the plurality of EBG cells includes conductor patterns formed in the supporting member and having a two-layer structure.

21. The semiconductor package of claim 20, wherein at least one of the plurality of EBG cells includes:
a first conductor pattern disposed on a first level of the supporting member;
a pair of second conductor patterns disposed on a second level of the supporting member; and a plurality of vias disposed between the first level and the second level to be connected to the pair of second conductor patterns and disconnected from the first conductor pattern.

22. The semiconductor package of claim 13, wherein the supporting member includes:
   an outer sidewall structure defining a contour of the supporting member; and
   an inner sidewall structure extended from the outer sidewall structure to an internal space and dividing the internal space into the first through-hole and the second through-hole.

23. The semiconductor package of claim 22, wherein the electromagnetic band-gap structure is disposed in a region of the outer sidewall structure that is connected to the inner sidewall structure.

24. The semiconductor package of claim 22, wherein the supporting member comprises a plurality of second through-holes including the second through-hole, and the plurality of second through-holes surround the first through-hole.

25. The semiconductor package of claim 24, wherein the inner sidewall structure includes:
   a first inner sidewall structure surrounding the first through-hole; and
   a second inner sidewall structure connecting the first inner sidewall structure and the outer sidewall structure to each other.

26. The semiconductor package of claim 25, wherein the electromagnetic band-gap structure is disposed in the second inner sidewall structure.

27. The semiconductor package of claim 25, wherein the electromagnetic band-gap structure is disposed in a region of the outer sidewall structure that is connected to the second inner sidewall structure.

* * * * *